United States Patent [19]
Shiraishi

[11] Patent Number: 5,982,489
[45] Date of Patent: *Nov. 9, 1999

[54] METHOD AND APPARATUS FOR MEASURING DEPTH OF A DEPRESSION IN A PATTERN BY LIGHT INTERFERENCE FROM CROSSED LIGHT BEAMS

[75] Inventor: Naomasa Shiraishi, Urawa, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/786,151

[22] Filed: Jan. 21, 1997

[30] Foreign Application Priority Data

Jan. 29, 1996 [JP] Japan ................................. 8-012879
Feb. 8, 1996 [JP] Japan ................................. 8-022708

[51] Int. Cl.$^6$ ........................................................ G01B 9/02
[52] U.S. Cl. .......................... 356/355; 356/357; 356/349
[58] Field of Search ........................ 356/354, 355, 356/356, 357, 349

[56] References Cited

U.S. PATENT DOCUMENTS

| | | |
|---|---|---|
| 3,819,274 | 6/1974 | Koulicovitch et al. ............... 356/357 |
| 4,408,884 | 10/1983 | Kleinknecht et al. ............... 356/355 |
| 5,384,639 | 1/1995 | Wickramasinghe ................. 356/355 |
| 5,448,357 | 9/1995 | Muraki .................................. 356/356 |

*Primary Examiner*—Samuel A. Turner
*Attorney, Agent, or Firm*—Klarquist Sparkman Campbell Leigh & Whinston, LLP

[57] ABSTRACT

A depth-measurement is disclosed for highly accurately measuring the depth (step difference) of depressions in a pattern in which depressions and protrusions periodically repeat, as in, e.g. a fine groove pattern. The depth measurement method is also for optically measuring the depth of depressions in a pattern formed so that depressions and protrusions periodically repeat in a specified direction on a substrate. The depth of the depressions is calculated based on photoelectrically converted signals of an integrated light flux of a first and second light beam obtained when an interference pattern is formed on the pattern by shining a first and second coherent light beam onto the pattern, and on the wavelengths of the first and second light beams. To highly accurately measure the depth (step difference) of the depressions in such a pattern formed so that depressions and protrusions periodically repeat in a specified direction, the depth of the depressions is calculated based on photoelectrically converted signals of the integrated light flux of the first and second light beams obtained for each of the multiple wavelengths, and on the multiple wavelengths.

29 Claims, 7 Drawing Sheets

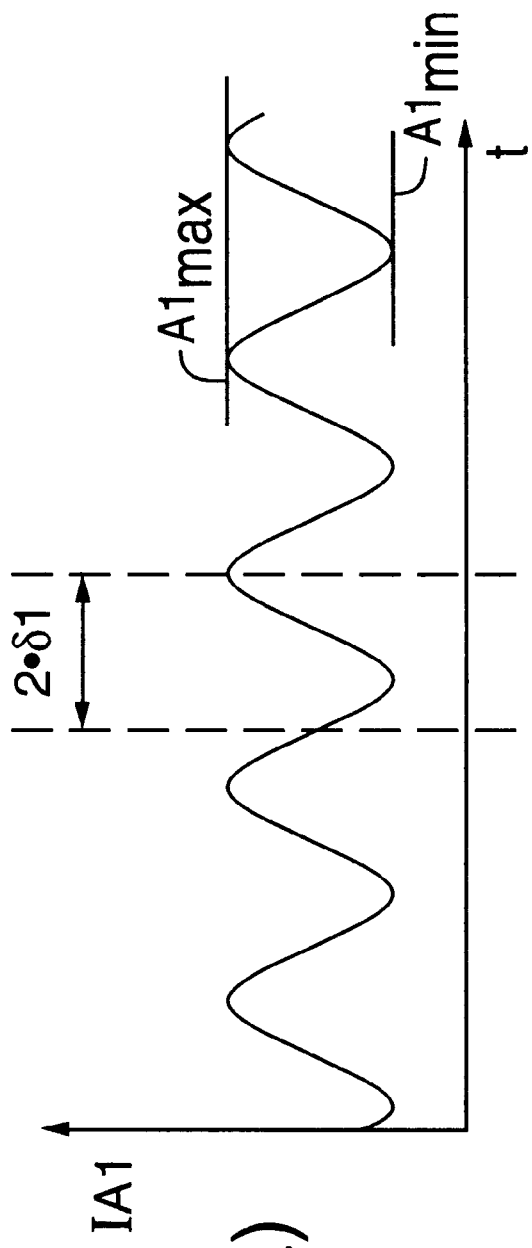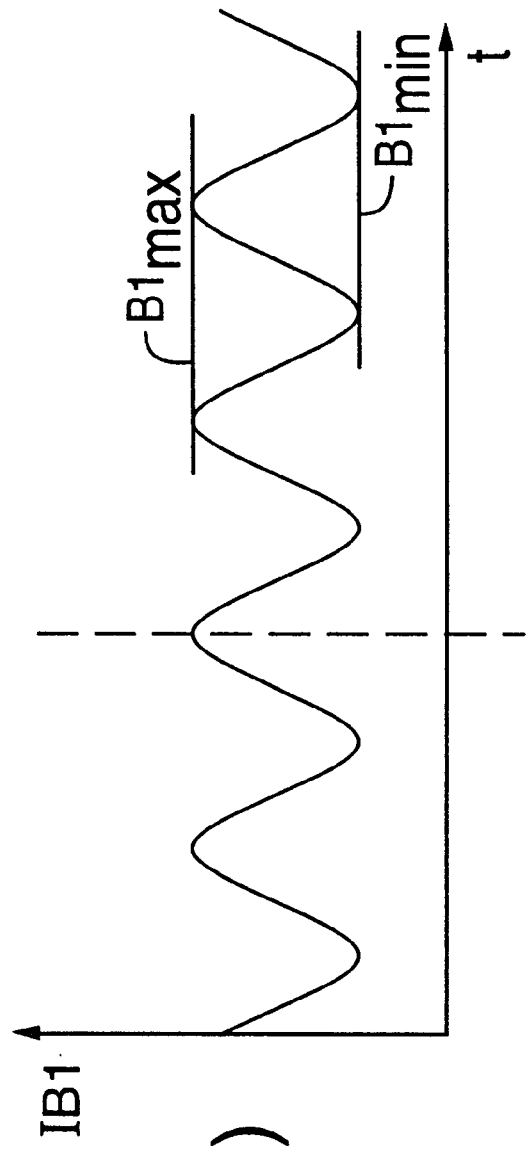

METHOD AND APPARATUS FOR MEASURING DEPTH OF A DEPRESSION IN A PATTERN BY LIGHT INTERFERENCE FROM CROSSED LIGHT BEAMS

BACKGROUND OF THE INVENTION

1. Field of the Invention

This invention pertains to a depth measurement method and a depth measurement apparatus for measuring depth or step difference of a depression in a pattern in which depressions and protrusions periodically repeat, and is specifically suited for use, e.g., when measuring the depth or step difference of fine groove patterns, such as the trench structure or alignment marks in a semiconductor element, and the like.

2. Related Background Art

For example, semiconductor elements are formed by layering multi-layered circuit patterns in specified positional relationships onto a wafer, and in the lithographic process for forming the circuit pattern for each layer, the pattern image of a reticle, which acts as a mask, is transferred onto a photoresist layer on the wafer at a specified magnification by an exposure device. And, when the reticle patterns are transferred onto the second and subsequent layers of the wafer by the exposure device, the location of the alignment marks formed on the wafer in the preceding processes is detected, and once the reticle pattern and the pattern already formed on each shot field on the wafer have been aligned with each other based on the results of this detection, so-called "overlay exposure" is performed.

The alignment marks on past wafers have usually been patterns in which depressions and protrusions periodically repeat formed on the wafer at a specified pitch along the direction of measurement. Below, these three-dimensional patterns which are thus periodically arranged in a specified direction will also be referred to as "groove patterns", and the fine patterns with small three-dimensional pitches within these groove patterns will be referred to as "fine groove patterns." When detecting alignment marks comprising this kind of fine groove pattern with, e.g., a photographic alignment sensor which uses an illumination light of a specified bandwidth, the parts in the image of the alignment mark which correspond to the boundaries between the protrusions and depressions may be a dark line, for example, making it possible to detect the dark line. There are also alignment sensors which perform position detection based on diffracted light in a specific direction from the fine groove pattern, such as the laser step alignment type (LSA type), which shines a light beam, such as a laser beam, onto alignment marks comprising a diffraction grating-shaped fine groove pattern, detects the diffracted light from that pattern and perform position detection based on the intensity of the diffracted light, or the two-beam interference type (LIA type) which shine coherent light beams from two directions onto the pattern, and perform position detection based on the phase of a beat signal obtained by photoelectrically converting a pair of diffracted lights exiting parallel to each other from the pattern.

For example, when performing position detection in this way, based on light diffracted in a specific direction from the fine groove pattern in this way, the intensity of the emitted diffracted light varies greatly, and in some cases the SN ratio of the resulting detection signal deteriorates, depending on the depth of the pattern depressions, i.e., with the step difference between the depressions and the protrusions. Consequently, it is necessary to control the manufacturing processes so that the depth of these patterns remains within a specified range, and for that it is necessary to precisely measure the depth of the patterns.

In addition, when it is necessary to precisely control the depth of a groove pattern other than alignment marks on a wafer, it is assumed that it will be necessary to measure their depth accurately. From the past, the method used for measuring the depth (or step difference) of a fine groove pattern has been to shine light fluxes of multiple wavelengths onto and around that fine groove pattern and calculate the depth from the spectral distribution of the normal reflected light.

This exploited the fact that reflected light from the bottom (depression) of the fine groove pattern and the reflected light from the upper surface (its surroundings) would interfere with each other, and that the reflected light of specific wavelengths would be stronger or weaker due to the phase difference which accompanies the difference in the light paths of the two reflected lights (2× the depth).

However, there was a problem in the prior art as described above in that the SN ratio of the obtained signal was not very good since detection was performed dependent on the intensity of the reflected light from the depressions in the groove pattern and from the are surround them. There was also the problem that, when the material of the groove pattern is one which gives rise to variations in the reflecting power within the wavelength band of the detection light, the variations in reflecting power for a wavelength peculiar to a material had an effect on the variations in reflecting power that accompanied the aforementioned depth variations, drastically reducing the accuracy of depth detection.

SUMMARY OF THE INVENTION

Compensating for this by entering the variations in reflecting power peculiar to the material in advance into the measuring apparatus has been considered. However, if there is a natural oxide film or an etching mask thin film for forming the step differences (boring) on the surface of the object to be measured, it is difficult to compensate for these factors because the reflecting power fluctuates with changes in the wavelength due to the interference effect of the thin film.

This invention is intended to address these points and to furnish a depth measurement method which is able to measure with high precision the depth (step difference) of the depressions in the pattern being detected of periodically repeating depressions, such as, e.g., a fine groove pattern.

Thus, the depth measuring method of this invention is one which optically measures the depth of the depressions in a pattern being detected in which depressions and protrusions periodically repeat which is formed on a substrate, wherein which depth measuring method an interference pattern is formed on the pattern being detected by shining a first and second coherent light beam onto the pattern being detected, and the depth of the depressions in the pattern being detected is calculated based on the photoelectrically converted signal of the integrated light flux of the first and second light beams obtained when the pattern being detected and the interference pattern are relatively scanned in a specified direction, and the wavelengths of the first and second light beams.

The phase and contrast of the photoelectrically converted signal of the first and second integrated light fluxes, the wavelengths of the first and second light beams, and the ratio of the widths of the depressions and the protrusions in the specified direction on the pattern being detected, as the shape of the pattern, can also be used in this invention when calculating the depth of the depressions in the pattern being detected. In this case, depth can be calculated with especially high precision since sufficient accuracy can be obtained even if the design value is used for the ratio of the widths of the depressions and the protrusions in the specified direction in the pattern being detected.

The depth measuring apparatus of this invention is one which optically measures the depth of the depressions in the pattern being detected in which depressions and protrusions periodically repeat which is formed on a substrate, wherein which depth measuring apparatus possesses (a) a light transmitting optical system that shines a first and second coherent beams onto the pattern being detected where an interference pattern with a 2P/N (N is a natural number) amplitude distribution period in the specified direction on the pattern being detected should be formed, wherein P is the period of the pattern being detected; (b) a first photoelectric converter element which receives a first integrated light flux, integrated from the normal reflected light of the first light beam from the pattern being detected and the N-order diffracted light of the second light beam from the pattern being detected; (c) a second photoelectric converter element which receives a second integrated light flux, integrated from the normal reflected light of the second light beam from the pattern being detected and the N-order diffracted light of the first light beam from the pattern being detected; (d) a relative scanning system which relatively scans the pattern being detected and an interference pattern in a specified direction, and (e) a depth calculator which calculates the depth of the depressions in the pattern being detected based on the photoelectrically converted signals output from the first and second photoelectric converter elements, and on the wavelengths of the first and second light beams, when the pattern being detected and the interference pattern are relatively scanned by the relative scanning system. The depth measuring method described above can be implemented by this depth measuring apparatus of this invention.

Another embodiment of this invention is intended to offer a depth measuring method which is able to highly accurately measure the depth (step difference) of the impressions in a pattern being detected in which depressions and protrusions periodically repeat, as in, e.g., a fine groove pattern, using multiple wavelengths.

The depth measuring method of this invention is one which optically measures the depth of the depressions in a pattern being detected in which depressions and protrusions periodically repeat which is formed on a substrate, wherein an interference pattern of multiple wavelengths is formed on the pattern being detected by shining multiple pairs of light beams with mutually differing wavelengths, each comprising a first and second coherent light beam, onto the pattern being detected, and the depth of the depressions in the pattern being detected is calculated based on the photoelectrically converted signals of the integrated light fluxes of the first and second light beams, obtained for each of the multiple wavelengths, when the pattern being detected and the interference pattern are relatively scanned in a specified direction, and on the multiple wavelengths.

Furthermore, if a light flux of a single wavelength $\lambda_1$ is used, the depression depth d is expressed as follows, using integer $J_1$ greater than zero and a phase $\theta_1$ ($0 \leq \theta_1 < 2\pi$)

$$d = (2\pi \cdot J_1 + \theta_1)\lambda_1/(4\pi) \quad (A1)$$

In this case, since the value of integer $J_1$ cannot be independently specified, the range of depths d which can be specified when a light flux of single wavelength is used is in the range from, e.g., 0 to $\lambda_1/2$. In contrast to this, by using a light flux of another wavelength $\lambda_2$, the depth of that depression d can be expressed as follows, using an integer $J_2$ greater than zero and a phase $\theta_2$ ($0 \leq \theta_1 < 2\pi$):

$$d = (2\pi \cdot J_2 + \theta_2)(\lambda_1/(4\pi) \quad (A2)$$

In this case also, the value of integer $J_2$ cannot be independently specified, but there are instances in which combinations of integers $J_1$ and $J_2$ can be determined by combining Equation (A1) and Equation (A2). Consequently, by using light beams of multiple wavelengths, the range of measurable depths d can be considerably broadened.

In addition, if the value of natural number N is 2 or greater, N-order diffracted light of 2-order or greater can be used instead of the 1-order diffracted light described above, in which case, the depth can be calculated just as in the case of 1-order diffracted light.

Yet another embodiment of this invention is a depth measurement apparatus which optically measures the depth of depressions in a pattern being detected in which depressions and protrusions periodically repeat which is formed on a substrate, wherein which depth measuring apparatus possesses (a) a light transmitting optical system that shines multiple pairs of light beams of mutually different wavelengths, each comprising a first and second coherent light beam, onto the pattern being detected, where interference patterns of multiple different wavelengths with a 2P/N (N is a natural number) amplitude distribution period in the specified direction on the pattern being detected should be formed, wherein P is the period of the pattern being detected; (b) a photoelectric converter element which receives a first integrated light flux, integrated from the normal reflected light of the first light beam from the pattern being detected and the N-order diffracted light of the second light beam from the pattern being detected, and a second integrated light flux, integrated from the normal reflected light of the second light beam from the pattern being detected and the N-order diffracted light of the first light beam from the pattern being detected: (c) a relative scanning system which relatively scans the pattern being detected and an interference pattern in a specified direction, and (d) a depth calculator which calculates the depth of the depressions in the pattern being detected based on the photoelectrically converted signal output from the photoelectric converter elements, and on the multiple wavelengths, when the pattern being detected and the interference pattern are relatively scanned by the relative scanning system.

BRIEF DESCRIPTION OF THE DRAWINGS

FIGS. 8(a)–8(b) is a waveform diagram showing examples of detection signals IA1 and IB1 obtained by the measuring apparatus in FIG. 5.

DESCRIPTION OF THE PREFERRED EMBODIMENTS

Example Embodiment 1 of this invention will be explained below, referring to the figures. This example is one in which this invention has been applied to an optical depth measuring apparatus to measure the depth (step difference) of the depressions in the alignment marks on a semiconductor wafer used in alignment in the exposure device.

Figure 1:
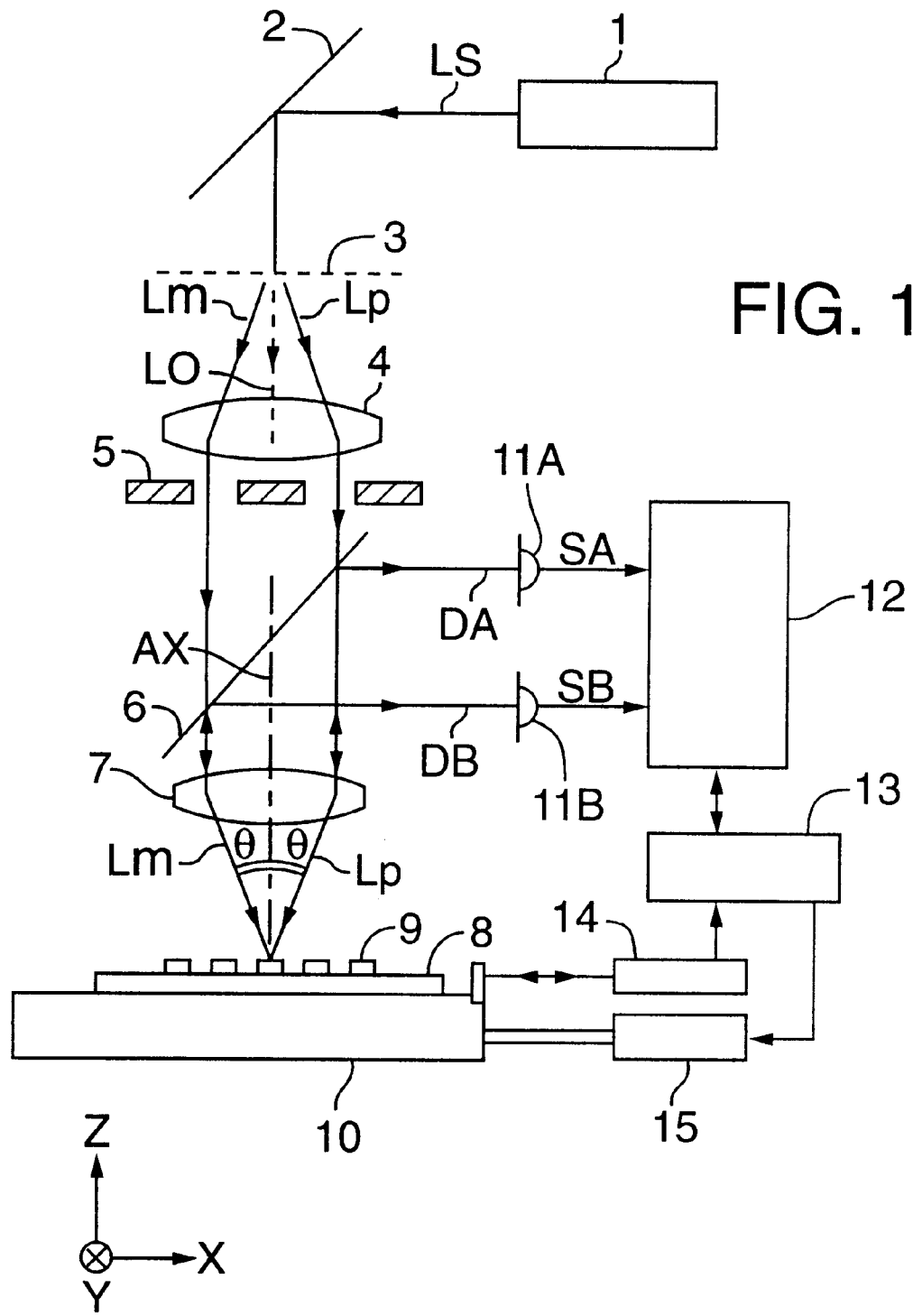
FIG. 1 is a partially cut-away structural drawing showing the depth measuring apparatus used in the first example embodiment of this invention.

FIG. 1 is a structural diagram schematically representing the optical depth measuring apparatus of this example, wherein which FIG. 1, a coherent light flux LS emitted by laser light source 1 enters a reference grating 3 via a mirror 2. 0-order diffracted light (direct light) LO, +1-order diffracted light Lp, −1-order diffracted light Lm, and 2-order or greater diffracted light are emitted from the reference grating 3. These light fluxes pass through a collimator lens 4, travel along mutually parallel paths to a spatial filter 5, where all the beams except the ±1-order diffracted light Lp and Lm are blocked by the spatial filter 5.

Of the ±1-order diffracted light Lp, Lm that has passed through the spatial filter 5, that light flux which is transmitted by a half mirror 6 (which light fluxes are also called "±1-order diffracted light Lp, Lm") is symmetrically shone through a condenser lens 7 onto the alignment marks 9 on a semiconductor wafer 8 which is the object being detected (hereinafter, simply called "the wafer") at a specified crossing angle. Below, the Z axis will be taken as parallel to the optical axis AX of the condenser lens 7, the X axis will be taken as being perpendicular to the Z axis and parallel to the plane of the paper, and the Y axis will be taken as perpendicular to the plane of the paper.

At this time, the wafer 8 in this example is held onto a wafer stage 10, which wafer stage 10 is used to adjust the position of the wafer 8 in the X and Y directions by stepping, and the position of the wafer 8 in the Z direction (focal position). The X coordinate and Y coordinate of the wafer stage 10 is constantly measured at a resolution of approximately 0.01 μm and the rotational angle (yawing) of the wafer stage 10 is measured by means of a movable mirror attached to the upper edge of the wafer stage 10 and an external laser interferometer 14, which measurement results are supplied to the main control system 13, which comprehensively controls the operation of the entire apparatus. The main control system 13 controls the position of the wafer stage 10 by means of the wafer stage drive system 15 based on the supplied measurement results and the target position of the wafer 8.

The alignment marks 9 on the wafer 8 in this example are the pattern being detected for the X axis which is formed of repeating depressions and protrusions at a specified pitch in the X direction, and below, the alignment marks 9 will be called the "periodic step difference pattern 9." At this time, the ±1-order diffracted lights Lp and Lm are shone so that they intersect at incident angle θ, symmetrically around the optical axis AX in the direction parallel to the X axis, on the periodic step difference pattern 9, forming an interference pattern at a specified pitch in the X direction on the periodic step difference pattern 9. In other words, with respect to the optical system comprising the collimator lens 4 and the condenser lens 7, the plane in which the reference grating 3 is located and the surface on which the periodic step difference pattern 9 is formed are conjugate. Where the period (pitch) of the periodic step difference pattern 9 in the X direction is represented by P and the wavelength of the beam LS is λ, the incident angle θ of the ±1-order diffracted lights Lp and Lm is set so as to fulfill the following equation:

$$\sin\theta = \lambda/(2P) \tag{1}$$

In this case, the period in the X direction of the amplitude distribution of the interference pattern formed on the periodic step difference pattern 9 by the ±1-order diffracted lights Lp and Lm is 2P. Adjustments to the incident angle θ so as to fulfill Equation (1) can be can be affected by, e.g., changing the period (pitch) of the reference grating 3 or by changing the focal length of the collimator lens 4 or the condenser lens 7. The optical system comprising the collimator lens 4 and the condenser lens 7 could be configured as a zoom lens system in order to facilitate continuous adjustment of the focal length of the latter.

Once the condition of the incident angle θ in Equation (1) has been met, of the normal reflected light (0-order diffracted light) and the 1-order or greater diffracted light emitted from the periodic step difference pattern 9, the normal reflected light of the −1-order diffracted light Lm emitted from the reference grating 3 and the +1-order diffracted light of the +1-order diffracted light Lp emitted in the same direction from the periodic step difference pattern 9 interfere with one another to become a first integrated light flux DA. At the same time, the normal reflected light of the +1-order diffracted light Lp emitted from the reference grating 3 and the −1-order diffracted light of the −1-order diffracted light emitted from the periodic step difference pattern 9 interfere with one another to become a second integrated light flux DB.

These integrated light fluxes DA and DB shine back along the path taken by the +1-order diffracted light Lp and the −1-order diffracted light Lm via the condensing lens 7 along mutually parallel paths to the half mirror 6, and the light fluxes reflected by the half mirror 6 (these light fluxes also are called "integrated light fluxes DA and DB") enter photoelectric detectors 11A and 11B, which consist of photodiodes or the like. Detection signals SA and SB obtained by photoelectrically converting the integrated light fluxes DA and DB in the respective photoelectric detectors 11A and 11B are then supplied to the step difference measuring unit 12. In addition, the information necessary for the step difference measuring unit 12 to calculate the depth has already been supplied to the step difference measuring unit 12 by the main control system 13.

In this condition, the main control system 13 scans the wafer stage 10 in the X direction at a constant speed by means of the wafer stage drive system 15, during which, the X coordinate and Y coordinate information for the wafer stage 10, which is intermittently measured by the laser interferometer 14 at a specified sampling frequency, is successively supplied to the step difference measuring unit 12. In accordance with this, as described below, the depth of the depressions (step difference) in periodic step difference pattern 9 is calculated by the step difference measuring unit 12 using the detection signals SA, SB and the X coordinates of the wafer stage 10 for the period during which the wafer stage 10 being scanned, which then supplies the calculation results to an external host computer, etc. via the main control system 13. These calculation results are, for example, fed back to the process for forming periodic step difference pattern 9, which process is used to adjust the depth of the periodic step difference patterns.

Next, the calculation principles for finding the depth of the depressions (step difference) in the period step difference pattern 9 by the detection signals SA, SB and other information, and an example of a method of that calculation will be explained, referring to FIG. 1 through FIG. 4.

First, there is a phase difference between the normal reflected light (0-order diffracted light) and 1-order diffracted light from periodic step difference pattern 9 due to the step in the pattern and other factors, but further phase differences develop accompanying positional shifts in the X direction between the reference grating 3 and the periodic step difference pattern 9 (positional shifts between the interference pattern created by the ±1-order diffracted lights Lp and Lm and the periodic step difference pattern 9). Consequently, the intensities of the integrated light fluxes DA and DB, and in turn the intensities of the detection signals SA and SB, vary as the relative positional relationship between the reference grating 3 and the periodic step difference pattern 9 is varied and, e.g., by scanning the wafer stage 10 in the period direction (X direction) of the periodic step difference pattern 9.

Figure 2A:
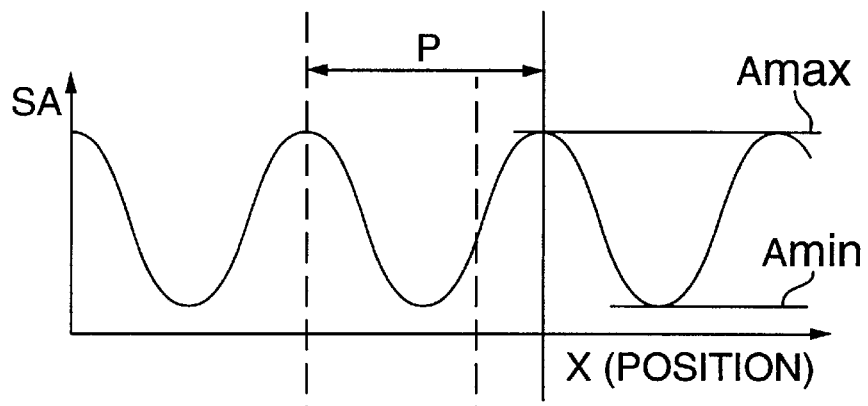
FIGS. 2(a)–2(b) is a waveform diagram showing examples of detection signals SA and SB from the measuring apparatus in FIG. 1.
Figure 2B:
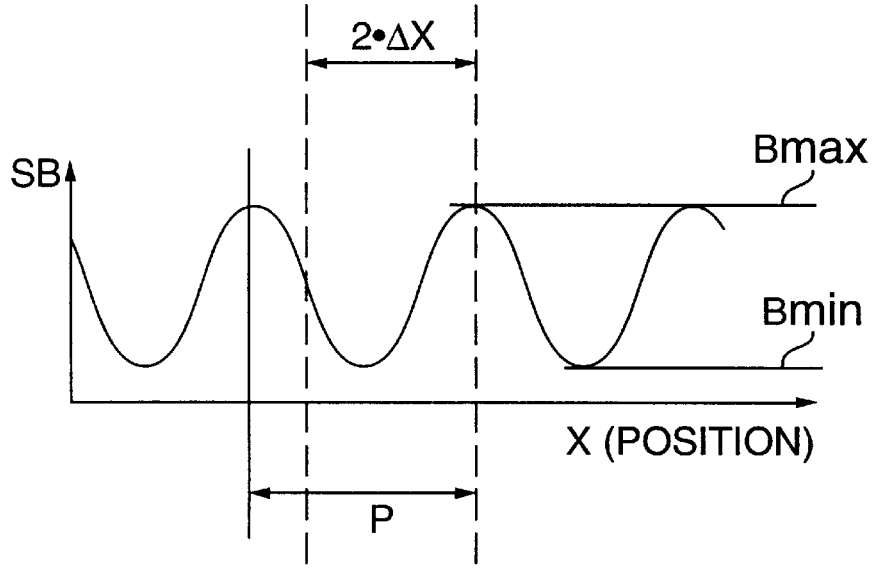

FIG. 2 shows an example of this kind of intensity changes in detection signals SA and SB accompanying scanning of the wafer stage 10, where, in FIGS. 2(a) and 2(b), the horizontal axes are the position of the wafer stage 10 in the X direction and the vertical axes are the intensities of the detection signals SA and SB. Since the period of the periodic step difference pattern 9 in the X direction in this example is P, as shown in FIG. 2, the detection signals SA and SB both become sine waves with the period P in the X direction of the wafer stage 10, but the position of the wafer stage 10, i.e., the position of the periodic step difference pattern 9, normally does not match with when the detection signals SA and SB reach their respective maximum intensities $A_{max}$ and $B_{max}$. Therefore, the positional difference (positional shift amount) in the X direction of wafer stage 10 (or periodic step difference pattern 9) when the detection signals SA and SB attain their respective maximum values $A_{max}$ and $B_{max}$ is $2\Delta X$. $\Delta X$ has the dimension of length, but if this is expressed as an angle (phase) $\delta$ [rad], using a conversion formula in which the period P of the sine wave is $2\pi$ [rad], the following becomes true:

$$\delta = 2\pi \cdot \Delta X/P \qquad (2)$$

Using the phase $\delta$ in Equation (2), the phase difference in the detection signals SA and SB can be expressed as $2\delta$. According to the analysis by the inventor in this application, this phase difference $2\delta$ is dependent upon the quantity of the step difference in periodic step difference pattern 9 and on the respective widths of the protrusions and depressions, and it conversely is possible to measure the depth (step difference) of the depressions in the periodic step difference pattern 9 from the phase difference $2\delta$ in those detection signals SA and SB and from the respective widths of the protrusions and the depressions in the periodic step difference pattern 9. This will be explained in detail below.

Figure 3:
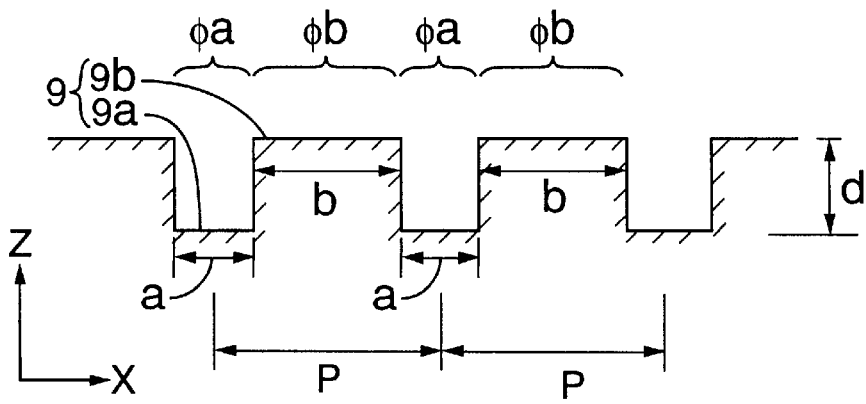
FIG. 3 is a magnified cross sectional diagram showing the step difference structure of periodic step difference pattern 9 in FIG. 1.

FIG. 3 is an enlarged drawing of the periodic step difference pattern 9 in FIG. 1, and as shown in FIG. 3, the periodic step difference pattern 9 is a pattern in which depressions 9a and protrusions 9b are arrayed at a period P in the X direction. Furthermore, the width of the depressions 9a in the X direction is a and the width of the protrusions 9b in the X direction is b (P=a+b), and the depth of the depressions 9a, i.e., the step difference between the depressions 9a and the protrusions 9b, is d. In addition, the amplitude reflecting powers of the depressions 9a and the protrusions 9b are $\Phi_a$ and $\Phi_b$, respectively. Now, these amplitude reflecting powers $\Phi_a$ and $\Phi_b$ express the amplitudes of the reflected light within the same plane (within a reference plane) in the direction of the depth of periodic step difference pattern 9 (the Z direction in FIG. 3). For example, if the surface of the protrusions 9b of periodic step difference pattern 9 is taken as this reference plane, then the amplitude reflecting power $\Phi_a$ in the depressions 9a would be the amplitude reflecting power at the surface of those depressions 9a multiplied by $\exp(4\pi i d/\lambda)$, which is a factor which corresponds with the difference in the round-trip light paths in the step difference (phase difference). In addition, excluding the exceptions described below, it is this phase difference $4\pi d/\lambda$ ($=\omega$) that is the total of the phase difference between the amplitude reflecting powers $\Phi_a$ and $\Phi_b$, and if the phase difference $\omega$ between $\Phi_a$ and $\Phi_b$ is found, then it is possible to find the step difference amount d.

Generally, the amplitude distributions in the diffraction directions of the diffracted light beams respectively emitted from the depressions 9a and protrusions 9b in FIG. 3 are expressed as sine functions. For example, if the amplitude distribution of the diffracted light emitted at diffraction angle $\theta$ to the period direction (X direction) of the periodic step difference pattern 9 from depressions 9a with width a is expressed as a function $\phi A(u)$ of the variable u, which corresponds with the order of that diffraction angle $\theta$, the following equation results:

$$\phi A(u) = \Phi_a \cdot \sin(\pi a u)/(\pi u) \qquad (3)$$

Here, the variable u, which corresponds with the order of diffraction, has the following relationship with the diffraction angle $\theta$, using the wavelength $\lambda$ of the diffracted light:

$$u = \sin\theta/\lambda \qquad (4)$$

Similarly, the amplitude distribution $\phi B(u)$ of the diffracted light emitted from the protrusions 9b with width b is as follows:

$$\phi B(u) = \Phi_b \cdot \sin(\pi b u)/(\pi u) \qquad (5)$$

In 0-order diffraction light (u=0), these amplitude distributions $\phi A(u)$ and $\phi B(u)$ become $a \cdot \Phi_a$ and $b \cdot \Phi_b$, respectively.

The amplitude distribution $\phi(u)$ of diffracted light at diffraction angle $\theta$ from periodic step difference pattern 9 comprising depressions 9a and protrusions 9b periodically arrayed at period (pitch) P in the X direction, as shown in FIG. 3, then becomes as follows:

$$\phi(u) = \{\phi A(u) + \phi B(u) \cdot \exp(\pi i P u)\} \cdot Pir(u) \qquad (6)$$

Wherein, the function Pir(u) in Equation (6) is expressed by the following equation, using m (an integer equal to or greater than 2) as the number of times that the periodic step difference pattern 9 repeats in the X direction:

$$Pir(u) = \sin(m\pi P u)/\sin(\pi P u) \qquad (7)$$

Now, in deriving Equation (6), the centers of the depressions 9a were used as the standard for the phase of the diffracted light, but of course, the centers of the protrusions 9*b* could also have been used.

The function Pir(u) in Equation (6) is called the "periodic term" of the diffraction grating, and if the number of repetitions m of the periodic step difference pattern 9 is large, the variable u will have a value m which is not 0 [zero] only at positions corresponding to j-order diffracted light, i.e., at positions where u=j/P (where j is an integer), and this value will be 0 in virtually all other places. Since only 0-order diffracted light and 1-order diffracted light from the periodic step difference pattern 9 are used in this example, the function Pir(u) can be a constant. In addition, the function exp($\pi$iu) in Equation (6) becomes 1 in 0-order diffracted light (u=0) and −1 in ±1-order diffracted light (u=±1/P).

Thus, as shown in FIG. 3, the amplitude $\phi_0$ of 0-order diffracted light and the amplitude $\phi_1$ of 1-order diffracted light emitted from periodic step difference pattern 9 are respectively expressed as follows:

$$\phi_0 = a' \cdot \Phi_a + b' \cdot \Phi_b \tag{8}$$

$$\phi_1 = a' \cdot \Phi_a - b' \cdot \Phi_b \tag{9}$$

Wherein coefficients a' and b' are respectively expressed as follows:

$$a' = P \cdot \sin(\pi a/P)/\pi \tag{10}$$

$$b' = P \cdot \sin(\pi b/P)/\pi \tag{11}$$

In this way, the process of deriving amplitudes $\phi_0$ and $\phi_1$ from amplitude reflecting powers $\Phi_a$ and $\Phi_b$ is described in FIG. 4 using polar coordinates in a Gaussian plane. Namely, the horizontal axes in FIGS. 4(*a*) through (*c*) are the Re axes (real axes) which express the real number portions, and the vertical axes are the Im axes (imaginary axes) which express the imaginary number portions, wherein FIG. 4, for the sake of simplicity, the amplitude reflecting power $\Phi_a$ is shown as a real number on the Re axis. Nonetheless, as long as the phase difference between amplitude reflecting powers $\Phi_a$ and $\Phi_b$ ($\omega$, as explained above) is unchanged, the derived result will not change even if the amplitude reflecting power $\Phi_a$ is a common complex number.

FIG. 4(*a*), then, expresses that the amplitude $\phi_0$ of 0-order diffracted light is determined by Equation (8) according to the amplitude reflecting powers $\Phi_a$ and $\Phi_b$, and FIG. 4(*b*) expresses that the amplitude $\phi_1$ of 1-order diffracted light is determined by Equation (9) according to the amplitude reflecting powers $\Phi_a$ and $\Phi_b$. In this case, the phase difference between the amplitude reflecting powers $\Phi_a$ and $\Phi_b$ is defined as $\omega$. FIG. 4(*c*) also shows the amplitudes $\phi_0$ and $\phi_1$ obtained from FIG. 4(*a*) and (*b*) in the same complex plane (polar coordinates), and the phase difference $\delta$ in FIG. 4(*c*) is an amount which is ½ the phase difference 2$\delta$ of the change in light quantity of integrated light fluxes DA and DB in response to the detection signals SA and SB in FIG. 2. The phase difference $\delta$ can be calculated with Equation (2) once the amount of positional shift 2·$\Delta$X between detection signals SA and SB shown in FIG. 2 has been measured.

Also, as for the ratio of the magnitudes of the amplitudes $\phi_1$ and $\phi_0$ ($|\phi_1|:|\phi_0|$), it is possible to measure this from the signals obtained by photoelectrically converting the above diffracted light. In other words, because the maximum values $A_{max}$ and $B_{max}$ of the detection signals SA and SB in FIG. 2 are the intensities under the condition in which amplitudes $\phi_0$ and $\phi_1$ were added in phase with each other, and the minimum values $A_{min}$ and $B_{min}$ of detection signals SA and SB are intensities under the condition in which amplitudes $\phi_0$ and $\phi_1$ were added 180° out of phase with each other, the following are true:

$$A_{max} = B_{max} = (|\phi_0| + |\phi_1|)^2 \tag{12}$$

$$A_{min} = B_{min} = (|\phi_0| - |\phi_1|)^2 \tag{13}$$

Also, due to the existence of Equations (12) and (13), the contrast $\gamma$ between the detection signals SA and SB is defined as follows:

$$\gamma = (A_{max} - A_{min})/(A_{max} + A_{min}) \tag{14}$$

Substituting this Equation (14) into Equations (12) and (13), the contrast $\gamma$ becomes as follows:

$$\gamma = 2 \cdot |\phi_0| \cdot |\phi_1|/(|\phi_0|^2 + |\phi_1|^2) \tag{15}$$

Consequently, by measuring the contrast $\gamma$ and substituting the following Equation (16), which includes the value of the ratio $\beta$ between the absolute value of amplitude $\phi_1$ and absolute value of amplitude $\phi_0$, into Equation (15), value of that ratio $\beta$ is expressed as in Equation (17).

$$|\phi_1| = \beta \cdot |\phi_0| \tag{16}$$

$$\beta = \{1 \pm (1-\gamma^2)^{1/2}\}/\gamma \tag{17}$$

The sign ± in Equation (17) cannot be definitively determined, but because the intensity of 1-order diffracted light is usually lower than that of 0-order diffracted light, the negative sign is used. However, the plus sign will be used in some cases, as described later. And, using the phase $\delta$ and the value of the ratio $\beta$ determined in Equation (17), the amplitude $\phi_1$ can be expressed by the following equation:

$$\phi_1 = \beta \cdot \phi_0 \cdot \exp(i\delta) \tag{18}$$

If the phase $\delta$ and the value of the ratio $\beta$ are found, as described above, it is possible to find the amplitude reflecting powers $\Phi_a$ and $\Phi_b$ of the depressions 9*a* and protrusions 9*b* in the periodic step difference pattern 9 from the amplitude of the diffracted light by back-tracking on the aforementioned process by which the amplitudes of the diffracted light were derived from the amplitude reflecting power. Specifically, this could be accomplished by solving the simultaneous equation comprising Equation (8) and Equation (9) based on known parameters.

Generally, in the fabrication of semiconductor integrated circuits, the controllability of the width of the pattern lines is greater than the controllability of fabricating the step difference amount, which is being measured. Consequently, the widths a, b of the depressions 9*a* and protrusions 9*b* in the periodic step difference pattern 9 shown in FIG. 3 are quite close to their respective design values, so that those design values can be used as known values. Similarly, the coefficients a' and b' resulting from Equations (10) and (11) can be treated as known values. Because of this, the only unknown variables (unmeasured variables) in the simultaneous equation comprising Equation (8) and Equation (9) are the amplitude reflecting powers $\Phi_a$ and $\Phi_b$, and the simultaneous equation can be solved for $\Phi_a$ and $\Phi_b$. As a result, the amplitude reflecting powers $\Phi_a$ and $\Phi_b$ can be expressed as follows. Now, Equation (18) has been substituted for amplitude $\phi_1$.

$$\Phi_a = (b' \cdot \phi_0 + b \cdot \phi_1)/(a \cdot b' + a' \cdot b) \quad (19)$$

$$\Phi_b = (a' \cdot \phi_0 - a \cdot \phi_1)/(a \cdot b' + a' \cdot b) \quad (20)$$

The phase of amplitude $\phi_0$ in Equation (19) and Equation (20) is not already known, but since it is sufficient as a final result to know the phase difference between the amplitude reflection powers $\Phi_a$ and $\Phi_b$ (=$\omega$), the phase of the amplitude $\phi_0$ (the angle made by amplitude $\phi_0$ with the Re axis in FIG. 4) can be set to any arbitrary value.

Consequently, the values of the amplitude reflecting powers $\Phi_a$ and $\Phi_b$ (complex numbers) can be found from Equation (19) and Equation (20). Both of the respective phases $\omega_a$, $\omega_b$ can then be found from the real number parts and imaginary number parts of the amplitude reflecting powers $\Phi_a$ and $\Phi_b$. In other words, where the real number parts and imaginary number parts of amplitude reflecting power $\Phi_a$ are Re($\Phi_a$) and Im($\Phi_a$), and the real number parts and imaginary number parts of amplitude reflecting power $\Phi_b$ are Re($\Phi_b$) and Im($\Phi_b$), the phases $\omega_a$ and $\omega_b$ are expressed as follows:

$$\omega_a = \tan^{-1}\{Im(\Phi_a)/Re(\Phi_a)\} \quad (21)$$

$$\omega_b = \tan^{-1}\{Im(\Phi_b)/Re(\Phi_b)\} \quad (22)$$

The difference between the two phases $\omega_a$ and $\omega_b$ ($\omega_b - \omega_a$) is then calculated as $\omega$, which becomes the phase difference between the amplitude reflecting powers $\Phi_a$ and $\Phi_b$. Also, as above, since there is usually a relationship ($4\pi d/\lambda = \omega$) between the step difference d in the periodic step difference pattern 9 in FIG. 3 and the phase difference $\omega$, the step difference d is calculated from that phase difference. The above comprises the principles for calculating the step difference d in this example.

Next, an example of the procedure for calculating the step difference d will be described. First, the wafer stage 10 in FIG. 1 is scanned in the period direction (X direction) of periodic step difference pattern 9, as described previously, and, accompanying this, the detection signals SA and SB obtained by photoelectrically converting the integrated light fluxes DA, DB by respective photoelectric detectors 11A, 11B are supplied to the step difference measuring unit 12. At the same time, the X coordinates and Y coordinates of the wafer stage 10 measured by the laser interferometer 14 are also sent to the step difference measuring unit 12 via the main control system 13. As shown in FIG. 2, the step difference measuring unit 12 finds the amount of positional shift $2 \cdot \Delta X$ in the detection signals SA and SB according to the internal phase difference detector, based on the relationship between the detection signals SA and SB and the X position of the wafer stage 10, and uses this positional shift amount and Equation (2) to calculate the phase difference $2\delta$ between the detection signals SA and SB.

Furthermore, using its internal peak hold unit and bottom hold unit, the step difference measuring unit 12 detects the maximum values $A_{max}$, $B_{max}$ and the minimum values $A_{min}$, $B_{min}$ of the detection signals SA, SB, as shown in FIG. 2, and substitutes the maximum value $A_{max}$ and minimum value $A_{min}$ of these into Equation (14) to calculate the contrast $\gamma$ in the detection signals SA, SB. Now, the contrast in the two detection signals will be equal as long as there is no excessive asymmetry in periodic step difference pattern 9, but in the event that the contrasts in the detection signals SA, SB were different, the contrast of detection signal SB could be found by substituting maximum value $B_{max}$ and minimum value $B_{min}$ instead of maximum value $A_{max}$ and the minimum value $A_{min}$ in Equation (14), and the average of the two resulting contrasts could be used for a new contrast $\gamma$.

Furthermore, the step difference measuring unit 12 substitutes that contrast $\gamma$ into Equation (17) to find the value $\beta$ of the ratio of the magnitudes of the amplitude $\phi_1$ of the 1-order diffracted light and the amplitude $\phi_0$ of the 0-order diffracted light and substitutes this, and the aforementioned phase difference $\delta$, into Equation (18) to find the precise relationship (as a complex number) between amplitude $\phi_1$ and amplitude $\phi_0$.

In addition, the operator can input the values of the widths a, b of the depressions 9a and protrusions 9b, respectively, in the periodic step difference pattern 9, the period P of the periodic step difference pattern 9, and the wavelength $\lambda$ of the light flux LS into the step difference measuring unit 12 via the console (not shown in the diagrams) and the main control system 13. The step difference measuring unit 12 then substitutes the input widths a, b and period P into Equation (10) and Equation (11) to calculate the values for coefficients a', b' then substitutes the calculated coefficients a', b' into Equation (19) and Equation (20) to find the values (complex numbers) of the amplitude reflecting powers $\Phi_a$, $\Phi_b$. Furthermore, it using Equation (21) and Equation (22) to find the respective phases $\omega_a$, $\omega_b$ of the amplitude reflecting powers $\Phi_a$, $\omega_b$, and then to calculate their phase difference $\omega$ (=$\omega_b - \omega_a$).

This phase difference $\omega$ corresponds to the difference in round-trip light paths (phase difference) in the step difference d in the periodic step difference pattern 9, as described above, and the step difference d is finally found by the step difference measuring unit 12 from $\omega = 4\pi d/\lambda$, i.e., the following relationship:

$$d = \omega \cdot \lambda/(4\pi) \quad (23)$$

Incidentally, in this example, the detected phase difference $\omega$ is a value within the range of 0 to $2\pi$ [rad] so that the step difference d is a value within the range of 0 to $\lambda/2$. Because of this, in periodic step difference patterns where step difference d is greater than $\lambda/2$, e.g., in periodic step difference patterns where step difference d is actually $0.7\lambda$, that step difference will be measured as being $0.2\lambda$ (=$0.7\lambda - \lambda/2$). Nonetheless, that measurement error of $\lambda/2$ (the difference between $0.7\lambda$ and $0.2\lambda$) is a quantity which is sufficiently discernible even in past depth measuring apparatuses, such that the problem of the $\lambda/2$ measurement error can be resolved by a method in which, e.g., after performing a rough depth measurement with a past depth measuring apparatus and determining the step difference d to be, e.g., $0.7\lambda \pm 10\%$, a precise measurement is performed using the measuring apparatus of this example.

In other words, employing Equation (23), the step difference d can generally be expressed as follows, using the integer k (k=0, 1, 2, . . . ):

$$d = (2\pi \cdot k + \omega) \cdot \lambda/(4\pi) \quad (24)$$

Therefore, an approximate depth measurement is performed first to determine the value $k_0$ for integer k and the value $\omega_0$ for phase difference $\omega$. The value $\omega_1$ for the phase difference $\omega$ is subsequently determined using the depth measuring apparatus of this example. At this time, if $\omega_1$ is in the neighborhood of 0 or $2\pi$, there are cases where the originally calculated phase difference $\omega_0$ differs from phase difference $\omega_1$ by about $2\pi$. In this kind of situation, depth measurement can be accurately accomplished, when the phase difference $\omega_1$ is near $2\pi$ and the phase difference $\omega_0$ is near 0, by substituting the integer ($k_0$-1) into Equation (24) for integer k instead of the integer $k_0$, while conversely, when the phase difference $\omega_1$ is near 0 and phase difference $\omega_0$ is near $2\pi$, by substituting the integer (k+1) into Equation (24) for integer k instead of the integer $k_0$.

Incidentally, the "magnitudes" of the amplitude reflecting powers $\Phi_a$, $\Phi_b$ of the depressions 9a and protrusions 9b in the periodic step difference pattern 9 shown in FIG. 3 vary according to the material (reflecting power) of the periodic step difference pattern 9, but in this example, the quantity of the step difference d can be found based only on the phase difference $\omega$ in the "magnitudes" (reflecting powers) of amplitude reflecting powers $\Phi_a$, $\Phi_b$, regardless of the "magnitudes" themselves. Consequently, the step difference can be accurately measured even in patterns in which the material differs between the depressions 9a and protrusions 9b in the periodic step difference pattern 9. In addition, if the materials of the depressions 9a and protrusions 9b in the periodic step difference pattern 9 are materials which give mutually different phase shifts to the reflected light (materials with complex refractive indexes], these phase shifts degrade the step difference measuring precision in the pattern, but this degradation generally is extremely small and is not large enough to pose a real problem to the measurement. Of course, it would also be possible to more precisely calculate this phase shift from the complex refractive indexes of the materials of the depressions and protrusions (which usually is already known), and thereby correct the measured phase difference (pattern step difference).

Furthermore, because the detection light fluxes are monochromatic in this example, there would obviously be no problem with the reflection spectrum of the pattern being detected, which has been a problem in past depth measuring apparatuses, making highly accurate depth measurement possible for patterns of any material.

In addition, in the condition of embodiment discussed above, as an example of a pattern being detected, a pattern was shown in which the boundaries (side walls) between the depression 9a and the protrusion 9b were plumb, as in the periodic step difference pattern 9 in FIG. 3, but highly accurate measurement is of course possible even if the pattern has tapered (slanted) side walls. In this case, the widths a, b of the depressions and protrusions entered in the step difference measuring unit 12 in FIG. 1 would no longer be values that fulfilled (a+b=P), but as in the above condition of embodiment, the step difference on the pattern can be calculated based on the values for these widths a, b.

Also, in cases when asymmetry (tapers, etc.) exist in the depressions of the pattern being detected, unlike the example shown in FIG. 2, the contrasts of detection signals SA, SB photoelectrically converted from integrated light fluxes DA, DB no longer match, but depth measurement with the same level of high accuracy as with a pattern with no asymmetry becomes possible by employing the average of the two.

Now, in the above condition of embodiment, an interference pattern of period 2P relative to the measurement direction is formed by shining two light fluxes onto the pattern being detected, which has a period P. However, it is also acceptable to form an interference pattern with an amplitude distribution period of 2P/N (N is an integer equal to or greater than 2) relative to the direction of measurement by shining two light fluxes onto the pattern being detected, which has a period P. In this case, if the 2 light fluxes are referred to as the first and second light flux, the normal reflected light of the first light flux (0-order diffracted light) from the pattern being detected and the N-order diffracted light of the second light flux from the pattern being detected are emitted parallel and interfere with each other to form a first integrated light flux, while the normal reflected light of the second light flux (0-order diffracted light) from the pattern being detected and the N-order diffracted light of the first light flux from the pattern being detected are emitted parallel and interfere with each other to form the second integrated light flux. Consequently, depth detection can be accomplished just as when an integrated light flux of 0-order diffracted light and 1-order diffracted light was used.

With the depth measuring method described above, because the depth of depressions in a pattern being detected is calculated based on the photoelectrically converted signals of first and second integrated light fluxes composed of respective diffracted light from the pattern being detected, the wavelength of the detection light beam, and the shape of the pattern being detected, it has the advantage of being able to perform high-precision measurement of the depth (step difference) of the depressions in the pattern being detected in which depressions and protrusions periodically repeat, such as a fine groove pattern. Particularly, the depth (step difference) of those depressions can be accurately measured with the above depth measuring method, even in detection patters where the reflecting power changes with the wavelength due to the characteristics peculiar to the material or due to thin film interference.

In addition, in cases where the phase and contrast of the photoelectrically converted signals from the first and second integrated light fluxes, the wavelengths of the first and second light beams, and the ratio of the widths of the depressions and the protrusions in a specified direction (measurement direction) of the pattern being detected are used in measuring the depth of depressions in those patterns, since the widths of the depressions and protrusions in the measurement direction are precisely fabricated, their depth can be accurately calculated by using the design values as those widths.

Next, a second example embodiment of this invention will be explained. This example is one in which this invention is applied to an optical depth measuring apparatus for measuring the depth (step difference) of alignment mark depressions used on a semiconductor wafer to align the wafer in an exposure device.

Figure 5:
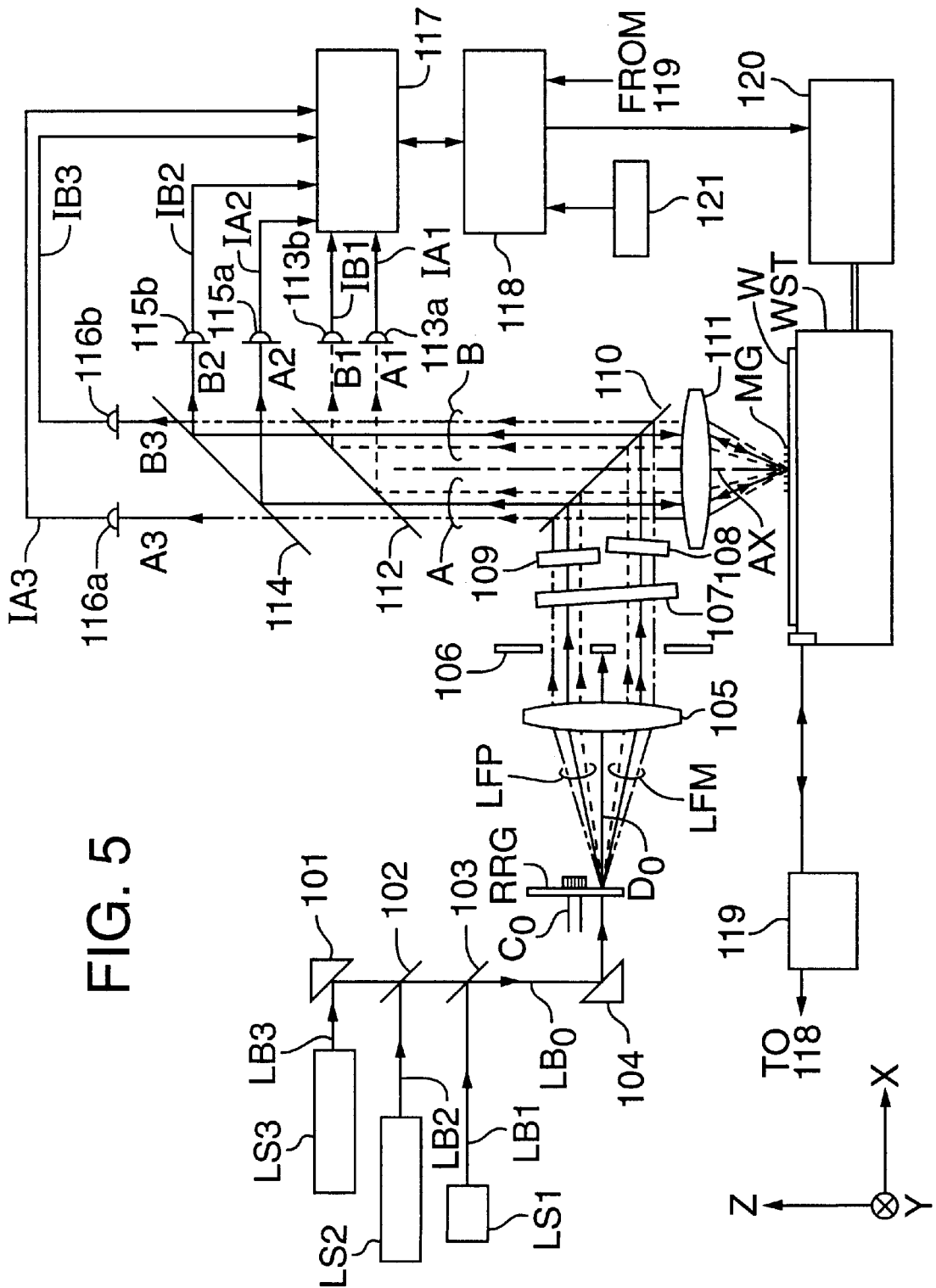
FIG. 5 is a partially cut-away structural drawing showing the depth measuring apparatus used in a second example embodiment of this invention.

FIG. 5 is a structural diagram conceptually illustrating the optical depth measuring apparatus in this example, and in this Figure the three laser light sources LS1, LS2, and LS3 emit coherent laser beams LB1, LB2 and LB3 of wavelengths $\lambda_1$, $\lambda_2$ and $\lambda_3$. As one example, laser light source LS1 is a He-Ne laser light source emitting a beam LB1 with a wavelength $\lambda_1$ of 633 nm, laser light source LS2 is a semiconductor laser light source emitting a beam LB2 with a wavelength $\lambda_2$ of 690 nm, and laser light source LS3 is another semiconductor laser light source emitting a beam LB3 with a wavelength $\lambda_3$ of 780 nm, which wavelengths have been chosen so as to have the relationship $\lambda_1<\lambda_2<\lambda_3$.

The three laser beams LB1, LB2 and LB3 are integrated via a mirror 101 and dichroic mirrors 2, 3 into a single, co-axial laser beam $LB_0$, which laser beam $LB_0$ is reflected by a mirror 4 and enters the rotating radial grating RRG. The rotating radial grating RRG spins in one direction at a high, isometric velocity about rotational axis $C_0$.

Figure 6:
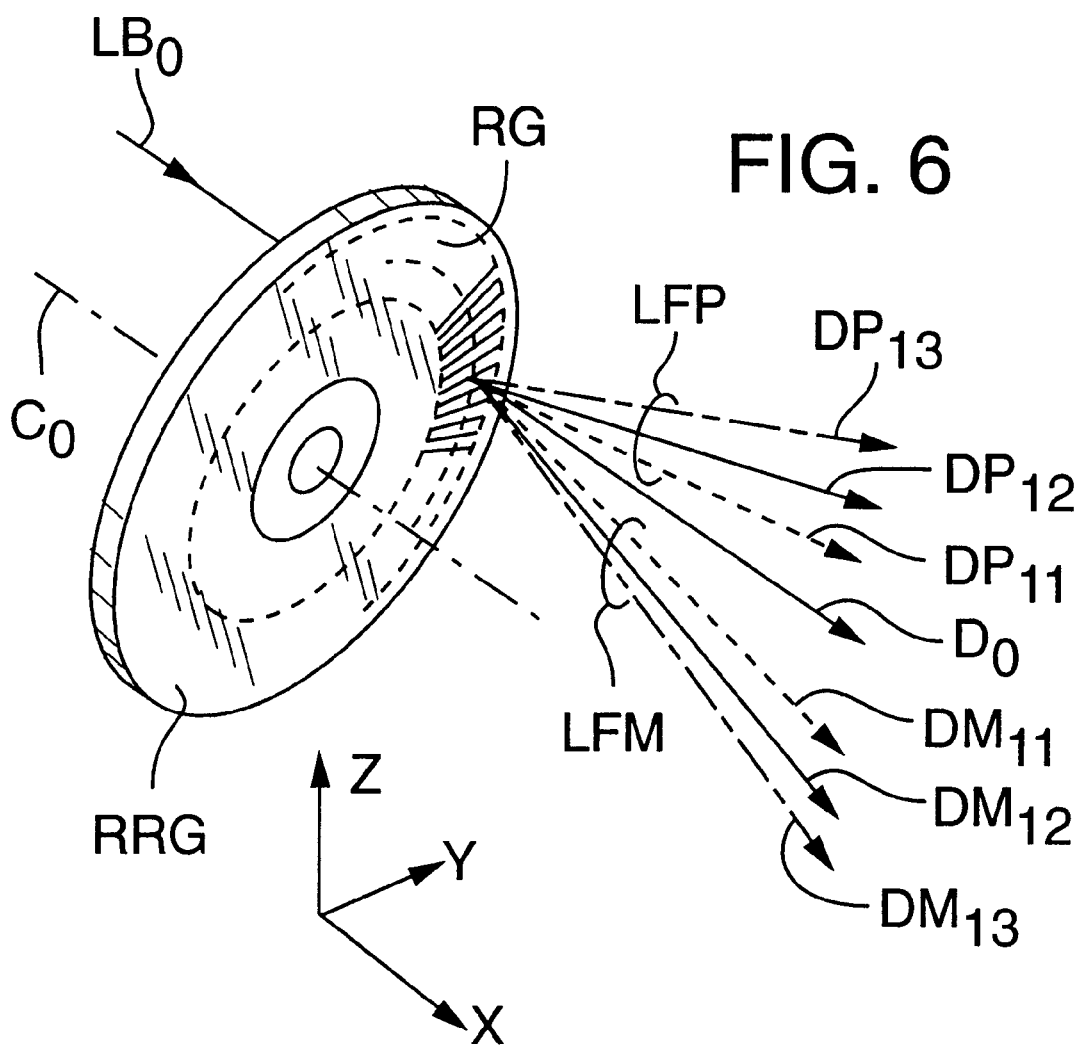
FIG. 6 is a magnified oblique view drawing showing the rotating radial grating RRG in FIG. 5.

FIG. 6 is a magnified, oblique-view drawing of the rotating radial grating RRG, and in FIG. 6 the rotational axis $C_0$ is situated parallel with the X axis of the X-Y-Z coordinate system. The rotating radial grating RRG consists of a phase diffraction grating RG of depressions and protrusions formed at a specified angular pitch around 360° of the perimeter of a transparent disc made from a glass substrate, centered around rotational axis $C_0$, and the laser beam $LB_0$, which contains light fluxes of 3 wavelengths, enters the phase diffraction grating RG at a right angle. As a result, a variety of diffracted lights other than 0-order diffracted light $D_0$ are emitted from the phase diffraction grating RG. Since ±1-order diffracted light is employed in this example to realize heterodyne interference, FIG. 6 shows only the +1-order diffracted light $DP_{11}$, $DP_{12}$ and $DP_{13}$ of the laser beams of wavelengths $\lambda_1$, $\lambda_2$ and $\lambda_3$ and the −1-order diffracted light $DM_{11}$, $DM_{12}$ and $DM_{13}$ of the laser beams of wavelengths $\lambda_1$, $\lambda_2$ and $\lambda_3$, coming from the rotating radial diffraction grating RGG. In addition, the three +1-order diffracted lights $DP_{11}$, $DP_{12}$ and $DP_{13}$ are collectively represented by transmission beam LFP, and the three −1-order diffracted lights $DM_{11}$, $DM_{12}$ and $DM_{13}$ are collectively represented by transmission beam LFM.

In this case, the wavelengths $\lambda_1$, $\lambda_2$ and $\lambda_3$ will be represented by wavelength $\lambda_n$ (n=1, 2, 3), and where the period of the phase diffraction grating RG at the radiation point of laser beam $LB_0$ is represented by $P_{rg}$, the diffraction angle $\theta_n$ of the 1-order diffracted light of the laser beam of wavelength $\lambda_n$ is expressed by the following:

$$\sin\theta_n = \lambda_n / P_{rg} \quad (25)$$

Meanwhile, because the rotating radial grating RRG spins about axis $C_0$ at a high, isometric velocity, the frequency of the various non-0-order diffracted lights from the rotating radial grating RRG increases or falls only with the angular velocity.

And, where the transmission beam LFP receives a constant frequency displacement $\Delta f$ independent of its wavelength, and where the velocity at which phase diffraction grating RG on the rotating radial grating RRG cuts across the laser beam $LB_0$, is V, that frequency displacement $\Delta f$ is expressed as follows:

$$\Delta f = V/P_{rg}$$

Consequently, the transmission beam LFP, which is composed of +1-order diffracted light, has a frequency which is only $\Delta f$ greater than the frequency of 0-order diffracted light $D_0$. Correspondingly, the frequency of transmission beam LFM, which is composed of −1-order diffracted light, is only $\Delta f$ lower than the frequency of the 0-order diffracted light $D_0$, independent of its wavelength. In other words, the rotating radial grating RRG also functions as a frequency shifter, and the frequency difference between the transmission beam LFP and the transmission beam LFM is $2 \cdot \Delta f$.

Returning to FIG. 5, the transmission beam LFP composed of the +1-order diffracted light of the laser beams of wavelengths $\lambda_1$–$\lambda_3$, the transmission beam LFM composed of the −1-order diffracted light of the laser beams of wavelengths $\lambda_1$–$\lambda_3$, and the beam $D_0$ composed of 0-order diffracted light are converted by a collimator lens 105 so their normal rays are parallel with each other, and enter the spatial filter 106, which functions as a beam selection member. The spatial filter 106 is arranged in the optical Fourier transformation plane relative to the rotating radial grating RRG, and blocks 0-order diffracted light $D_0$ and transmits only the transmission beams LFP and LFM.

After the transmission beams LFP and LFM pass the spatial filter 106, they pass through a tiltable plane-parallel glass plate 7, which acts as a regulating optical system, then transmission beam LFP and transmission beam LFM pass through respective regulating optical systems consisting of tiltable plane-parallel glass plates 108 and 109 to reach a beam splitter 110. Plane-parallel glass plate 107 has the function of simultaneously decentering the transmission beams relative to the optical axis of the collimator lens 105 without changing the spacing between transmission beams LFP and LFM in Fourier space, and the plane parallel glass plates 109 and 108 each has the function of individually adjusting the positions of transmission beam LFP and transmission beam LFM relative to their own respective optical axes. Now, a half mirror may be used instead of the beam splitter 110.

And, the light fluxes of transmission beams LFP and LFM reflected by the beam splitter (these light fluxes also will be called "transmission beams LFP and LFM") are made mutually parallel by objective lens 111 and shine onto the alignment mark MG as the pattern being detected on the semiconductor wafer (below called simply "wafer") W at unique crossing angles for each wavelength. In the explanation below the Z axis will be taken as parallel to the light axis AX of the objective lens 111, the X axis will be taken as in a plane perpendicular to the Z axis and parallel to the plane of the paper in FIG. 5, and the Y axis will be taken as perpendicular to the plane of the paper in FIG. 5.

At this time, the wafer W in this example is held onto a wafer stage WST, which wafer stage WST is used to adjust the position of the wafer W in the X and Y directions by stepping, and the position of the wafer W in the Z direction (focal position). The X coordinate and Y coordinate of the wafer stage WST are constantly measured at a resolution of approximately 0.01 μm and the rotational angle (yawing) of the wafer stage WST is measured by means of a movable mirror attached to the upper edge of the wafer stage WST and an external laser interferometer 119, which measurement results are supplied to the main control system 118, which comprehensively controls the operation of the entire apparatus. The main control system 118 controls the position of the wafer stage WST by means of the wafer stage drive system 120 based on the supplied measurement results and the target position of the wafer W. In addition, an input device 121, such as a consoled, etc., is connected to the main control system 118 in order for the operator to input various data and commands.

The alignment marks MG on the wafer W in this example are identical to the alignment marks 9a and 9b shown in FIG. 3. As shown in FIG. 3, the alignment marks MG (9) constitute a detection pattern for the X axis which is formed so that a pattern in which depressions and protrusions periodically repeat at period (pitch) P in the direction of the X axis, which alignment marks MG will be called the "periodic step difference pattern MG" below. At this time, since the transmission beams LFP and LFM enter the periodic step difference pattern MG symmetrically along the X direction, an interference pattern created by interference of the ±1-order diffracted lights $DP_{11}$, $DM_{11}$ of wavelength $\lambda_1$ (see FIG. 4), an interference pattern created by interference of the ±1-order diffracted lights $DP_{12}$, $DM_{12}$ of wavelength $\lambda_2$, and an interference pattern created by interference of the ±1-order diffracted lights $DP_{13}$, $DM_{13}$ of wavelength $\lambda_3$ appear overlaid on the periodic step difference pattern MG at the same period in the X direction and in the same phase.

Furthermore, because the frequency difference between the transmission beams LFP and LFM is $2 \cdot \Delta f$, the interference patterns formed by those beams is observed to move at a constant velocity in the +X direction (or the −X direction) on the periodic step difference pattern MG. And, the velocity of this motion is proportional to the velocity V at the point of incidence of the laser beams into the phase diffraction grating RG on the rotating radial grating RRG. Now, as is clear from FIG. 5, the surface of the wafer W (the formation surface of the periodic step difference pattern MG) and the grating surface of the rotating radial grating RRG are arranged so as to be conjugate (are in an image formation relationship) with each other around the integrated system of the collimator lens 105 and the objective lens 111. Because of this, the interference pattern (diffraction image) of transmission beams LFP and LFM of the phase diffraction grating RG on the rotating radial grating RRG is formed on the periodic step difference pattern MG on the wafer W. At this time, because the 0-order diffracted light $D_0$ is blocked, the magnification of the integrated system is 1, and the interference pattern appears as an image of dark and light stripes with a period ½ the period at the point of incidence of the laser beams on phase diffraction grating RG.

In this example, the period $P_{if}$ in the X direction of the amplitude of the interference pattern on the wafer W (2 times the period of the intensity distribution) is set to be 2 times the period P of the periodic step difference pattern MG. At this time, for the three aforementioned wavelengths $\lambda_1-\lambda_3$, the 0-order diffracted light (normal reflected light) of the first transmission beam LFP from the periodic step difference pattern MG and the 1-order diffracted light of the second transmission beam LFM from the periodic step difference pattern MG are emitted in the same direction and interfere with each other to become the first integrated flux B, while the 0-order diffracted light (normal reflected light) of the second transmission beam LFP from the periodic step difference pattern MG and the 1-order diffracted light of the first transmission beam LFM from the periodic step difference pattern MG are emitted in the same direction and interfere with each other to become the second integrated flux A. In this case, integrated light flux A is composed of integrated light flux A1 of wavelength $\lambda_1$, integrated light flux A2 of wavelength $\lambda_2$ and integrated light flux A3 of wavelength $\lambda_3$, and integrated light flux B is composed of integrated light flux B1 of wavelength $\lambda_1$, integrated light flux B2 of wavelength $\lambda_2$ and integrated light flux B3 of wavelength $\lambda_3$. And, these integrated light fluxes A and B together constitute a beat beam (heterodyne beam) which is intensity-modulated at the frequency 2·Δf corresponding to the frequency difference in the incident transmission beams LFP and LFM.

Now, in order to thus cause the 0-order diffracted beams and 1-order diffracted beams to be emitted in the same direction from the periodic step difference pattern MG, to consider the problem from another viewpoint, the distance between the transmission beams LFP and LFM at the various wavelengths $\lambda_n$ (n=1, 2, 3) in the Fourier transform plane (adjacent to the beam splitter 110) may be set as follows, with respect to the period direction (X direction) of the periodic step difference pattern MG, where the focal length of the objective lens 111 is $F_0$:

$$DL_n = F_0 \cdot \lambda_n / P \qquad (26)$$

Setting the distance $DL_n$ for each wavelength in this way can be accomplished by appropriately determining of period of the phase diffraction grating RG on the rotating radial grating RRG and/or the focal length for the collimator lens 5.

Furthermore, it is desirable for the transmission beams LFP and LFM to enter the periodic step difference pattern MG (wafer W) at equal angles and symmetrically around a straight line parallel with the light axis AX in order to prevent errors in step difference measurement even in conditions where the periodic step difference pattern MG is somewhat defocused (shifted in the direction of the light axis AX). This may be accomplished by passing the light fluxes of the various wavelengths in transmission beams LFP and LFM through positions on the Fourier transformation plane which are separated from each other in the opposite direction by a distance of $DL_n/2$ along the period direction of the periodic step difference pattern MG from the light axis AX.

Incidentally, if there is chromatic aberration in the collimator lens 105 or the objective lens 111, etc., it is possible that the position of the interference patterns formed on the wafer W by the transmission beams LFP, LFM comprising the light fluxes of 3 wavelengths to shift from each other according to the wavelength (period shift). Therefore, the optical system comprising the plane-parallel glass plates 107, 108 and 109 in FIG. 5 can be used to correct this positional shift. By adjusting the amount of tilt in the plane-parallel glass plates 107, 108 and 109, the period of each wavelength component in the interference patterns formed on the wafer W can be fine-tuned to compensate for the positional shift.

Thus, the aforementioned integrated light fluxes A, B emitted from the periodic step difference pattern MG illuminated by the interference pattern, as described above, pass through the objective lens 111 and beam splitter 110 to reach the dichroic mirror 112. The integrated light fluxes A1, B1 of wavelength $\lambda_1$ in integrated light fluxes A and B are reflected by the dichroic mirror 112 and enter respective photoelectric detectors 113a, 113b, which consist of photo diodes or the like, and the detection signals IA1, IB1 obtained by photoelectrically converting integrated light fluxes A1, B1 with the photoelectric detectors 113a, 113b are supplied to the step difference measuring unit 117.

In addition, the integrated light fluxes A2, B2 of wavelength $\lambda_2$ and the integrated light fluxes A3, B3 of wavelength $\lambda_3$ in integrated light fluxes A, B pass through the dichroic mirror 112 and reach the dichroic mirror 114. The integrated light fluxes A2, B2 of wavelength $\lambda_2$ are then reflected by dichroic mirror 114 to enter respective photoelectric detectors 115a, 115b, which consist of photodiodes or the like, and the detection signals IA2, IB2 obtained by photoelectrically converting integrated light beams A2, B2 by means of photoelectric detectors 115a, 115b are supplied to the step difference measuring unit 117. Meanwhile, the light fluxes A3, B3 of wavelength $\lambda_3$ pass through dichroic mirror 114 and enter respective photoelectric detectors 116a, 116b, which consist of photodiodes or the like, and the detection signals IA3, IB3 obtained by photoelectrically converting the integrated light fluxes A3, B3 by means of the photoelectric detectors 116a, 116b are supplied to the step difference measuring unit 117.

In this way, while the interference patterns are illuminating the periodic step difference pattern MG on the wafer W, each of the three pairs of detection signals IA1, IB1, IA2, IB2, IA3 and IB3 supplied to the step difference measuring unit 117 becomes a sine wave of the same frequency as the beat frequency 2·Δf. And, as described below, the step difference measuring unit 117 calculates the step difference in the periodic step difference pattern MG based on these detection signals and other information and sends the calculation results via the main control system 118 to an external host computer, etc. Those calculation results may, e.g., be fed back to a process of manufacturing the periodic step difference pattern MG in order to regulate the depth of the periodic step difference pattern in that process.

Now, in the structure of FIG. 5, since it is possible for there to be insufficient wavelength separation by the dichroic mirrors 112 and 114 due to the interval between the wavelengths being used $\lambda_1$, $\lambda_2$, $\lambda_3$, an interference filter (narrow band-pass filter) which transmits only light flux of the intended wavelength may be situated directly in front of each photoelectric detector 113a, 113b, 115a, 115b, 116a and 116b.

Also, semiconductor lasers light sources are used for laser light sources LS2, LS3, but the laser beams from semiconductor lasers light sources tend to have astigmatism. Therefore, it is desirable to place a corrective optical system (e.g., several tilted plane-parallel glass plates, etc.) for eliminating astigmatism between the laser light sources LS2, LS3 and the dichroic mirrors 102, 103 to shape the sectional profile of the light flux component of each wavelength in the single integrated laser beam LB0 into circles of nearly equal diameter. In other cases as well, it is desirable to incorporate beam shaping optical systems so that the sectional profile of the integrated laser beam $LB_0$ is the same size as that of each wavelength component.

Also, a rotating radial grating RRG was used as a frequency shifter in FIG. 5 to simplify explanation, but it is possible to use two acoustic-optical modulators (AOM) or a first Zeeman laser which oscillates at central wavelength $\lambda_1$ and a second Zeeman laser which oscillates at central wavelength $\lambda_2$. Also, it is possible to replace the dichroic mirrors 102, 103, etc. with dispersion elements, such as prisms, etc.

Figure 7:
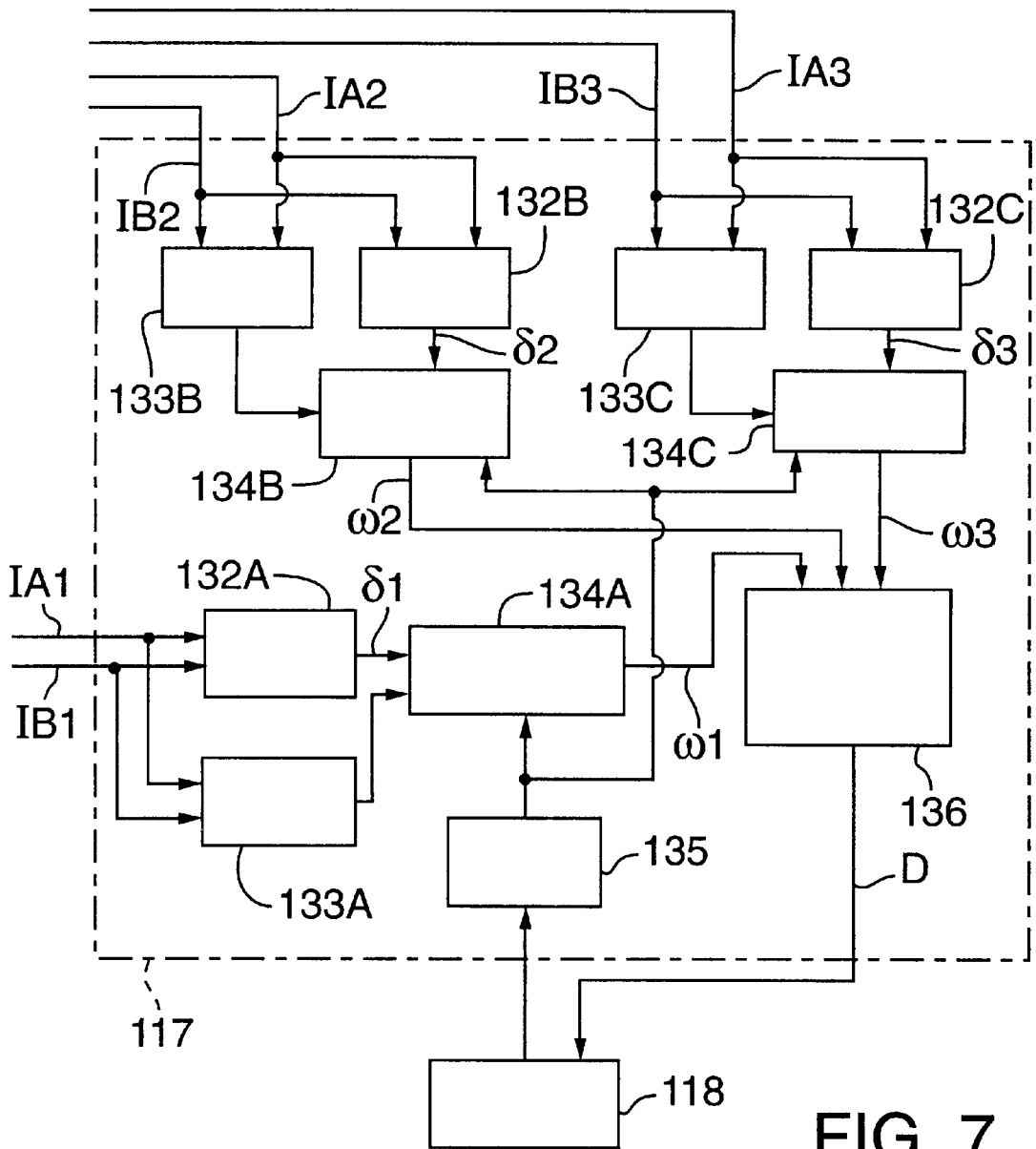
FIG. 7 is a block diagram showing a structural example of the step difference measurement area in FIG. 5.

Next, a concrete example of the structure of the step difference measuring unit 117 in FIG. 5 will be described referring to FIG. 7. FIG. 7 shows the step difference measuring unit 117, and in FIG. 7 the detection signals IA1, IB1 corresponding to integrated light fluxes A1, B1 of wavelength $\lambda_1$ in FIG. 5 are being supplied to the phase difference detector 132A and the contrast detector 133A. In the case of a heterodyne interference system like the device shown in FIG. 5, as described above, when the transmission beams LFP, LFM illuminate the area of the periodic step difference pattern MG on the wafer W, the detection signals IA1, IB1 both become sine waves of a frequency which is the same as the beat frequency 2·Δf.

FIGS. 8(a) and (b) show the detection signals IA1 and IB1, respectively, and as shown in FIG. 8, both detection signals IA1, IB1 become sine waves with a frequency 2·Δf, but positions of their maximum intensities $A1_{max}$ and $B1_{max}$ normally do not match. One-half of the difference in the maximum intensity position (phase difference) is defined as δ1 [rad]. And, that ½ phase difference δ1 is calculated by the phase difference detector 32A in FIG. 7 and supplied to the individual step difference calculator 134A.

Returning to FIG. 7, the contrast calculator 133A calculates the contrasts in the two detection signals IA1, IB1 and supplies these to the individual step difference calculator 134A. A variety of data are supplied to the individual step difference calculator 134A by the main control system 118 via the memory 135. And, the phase difference $\omega_1$ at the wavelength $\lambda_1$ corresponding to the step difference in the periodic step difference pattern MG, as explained below, is calculated by individual step difference calculator 134A using said phase difference δ1 and the widths of the depressions and the protrusions of the periodic step difference pattern MG, etc.

Similarly, the detection signals IA2, IB2 corresponding to integrated light fluxes A2, B2 of wavelength $\lambda_2$ in FIG. 5 are supplied to the phase difference detector 132B and the contrast detector 133B, and the phase difference δ2 which is ½ the phase difference between the two detection signals IA2, IB2 is calculated by the phase difference detector 132B and supplied to the individual step difference calculator 134B, and the contrasts in the detection signals IA2, IB2 are calculated by the contrast detector 133B and sent to the individual step difference calculator 134B. In parallel with these, the detection signals IA3, IB3 corresponding to integrated light fluxes A3, B3 of wavelength $\lambda_3$ in FIG. 5 are supplied to the phase difference detector 132C and the contrast detector 133C, and the phase difference δ3 which is ½ the phase difference between the two detection signals IA3, IB3 is calculated and sent to the individual step difference calculator 134C, and the contrasts in the detection signals IA3, IB3 are calculated by the contrast detector 133C and supplied to the individual step difference calculator 134C. A variety of data are also supplied to the individual step difference calculators 134B, 134C by the main control system 118 via the memory 135, whereby the individual step difference calculator 134B calculates the phase difference $\omega_2$ based on the wavelength $\lambda_2$ of the step difference in the periodic step difference pattern MG and the individual step difference calculator 134C calculates the phase difference $\omega_3$ based on the wavelength $\lambda_3$ of the step difference in the periodic step difference pattern MG.

The phase differences $\omega_1$–$\omega_3$ calculated by the individual step difference calculators 134A–134C are then supplied to the final step difference calculator 136, which final step difference calculator 136 calculates the step difference D of the periodic step difference pattern MG based on the wavelengths $\lambda_1$–$\lambda_3$, as explained below, and supplies the calculation results to the main control system 118. An example of the individual step difference calculators 134A–134C and the final step difference calculator 136 in this example would be functions in computer software.

In this case, the detection signals IA2, IB2 and IA3, IB3 are nearly the same kind of sine waves as the detection signals IA1, IB1, but the phase differences δ2, δ3 which are ½ the mutual phase differences usually take on different values from the phase difference δ1.

Now, the inventor in this application showed that these phase differences δ1–δ3 depend on the step difference in the periodic step difference patterns and on the respective widths of the depressions and protrusions therein, and the principles of calculating the step difference and an example of a concrete calculation method will be explained below.

As the periodic step difference pattern MG in FIG. 5 is the same pattern as that in FIG. 3, this explanation will overlap some with the principles explained in FIG. 3. The enlarged diagram of the periodic step difference pattern MG, as shown in FIG. 3, is a pattern in which depressions (corresponding to 9a in FIG. 3) and protrusions (corresponding to 9b in FIG. 3) in the periodic step difference pattern MG are arranged at period P in the X direction. Furthermore, the width of the depressions in the X direction is a, and the width of the protrusions in the X direction is b (P=a+b), and as in the pattern 9 shown in FIG. 3, the depth of the depressions, in other words, the step difference from the depressions to the protrusions, is defined as d. In addition, the amplitude reflecting powers of the depressions and protrusions are represented by $\Phi_a$ and $\Phi_b$, respectively. The amplitude reflecting powers $\Phi_a$, $\Phi_b$ are taken as expressing the amplitude of the reflected light in the same plane (in the reference plane) in the depth direction of the periodic step difference pattern MG (the Z direction in FIG. 3). For example, if this reference plane is taken as the surface of the protrusions of the periodic step difference pattern MG, then the amplitude reflecting power $\Phi_a$ in the depressions is the amplitude reflecting power at the surface of that depression multiplied by $\exp(4\pi i d/\lambda)$, which is a factor which corresponds to the difference in the round-trip path (phase difference) of the step difference d. Also, aside from the exceptions described below, it is this phase difference $4\pi d/\lambda$ (=$\omega$) itself that represents the entire phase difference between the amplitude reflecting powers $\Phi_a$ and $\Phi_b$, where if the phase difference $\omega$ between $\Phi_a$ and $\Phi_b$ is found, it is possible to find the step difference d.

Generally, the amplitude distributions in the diffraction directions of the diffracted light beams respectively emitted from the depressions and protrusions in the periodic step difference pattern MG are expressed as sine functions. For example, if the amplitude distribution of the diffracted light emitted at diffraction angle $\theta$ to the period direction (X direction) of the periodic step difference pattern MG from depressions with width a is expressed as a function $\phi A(u)$ of the variable u, which corresponds with the order of that diffraction angle $\theta$, Equation (3), discussed above, results:

$$\phi A(u) = \Phi_a \cdot \sin(\pi a u)/(\pi u) \quad (3)$$

Here, the variable u, which corresponds with the order of diffraction, has the relationship of Equation (4), discussed above, with the diffraction angle $\theta$, using the wavelength $\lambda$ of the diffracted light:

$$u = \sin\theta/\lambda \quad (4)$$

Similarly, the amplitude distribution $\phi B(u)$ of the diffracted light emitted from the protrusions with width b is as shown in Equation (5), discussed above:

$$\phi B(u) = \Phi_b \cdot \sin(\pi b u)/(\pi u) \quad (5)$$

In 0-order diffraction light (u=0), these amplitude distributions $\phi A(u)$ and $\phi B(u)$ become $a \cdot \Phi_a$ and $b \cdot \Phi_b$, respectively.

The amplitude distribution $\phi(u)$ of diffracted light at diffraction angle $\theta$ from periodic step difference pattern MG comprising depressions and protrusions periodically arrayed at period (pitch) P in the X direction of periodic step difference pattern MG, as with the protrusions $9a$ and depressions $9b$ shown in FIG. 3, then becomes as in Equation (6), discussed above:

$$\phi(u) = \{A(u) + \phi B(u) \cdot \exp(\pi i P u)\} \cdot Pir(u) \quad (6)$$

Wherein, the function Pir(u) in Equation (6) is expressed by Equation (7), discussed above, using m (an integer equal to or greater than 2) as the number of times that the periodic step difference pattern MG repeats in the X direction:

$$Pir(u) = \sin(m\pi P u)/\sin(\pi P u) \quad (7)$$

Now, in deriving Equation (6), the centers of the depressions were used as the standard for the phase of the diffracted light, but of course, the centers of the protrusions could also have been used.

The function Pir(u) in Equation (6) is called the "periodic term" of the diffraction grating, and if the number of repetitions m of the periodic step difference pattern MG is large, the variable u will have a value m which is not 0 [zero] only at positions corresponding to j-order diffracted light, i.e., at positions where u=j/P (where j is an integer), and this value will be 0 in virtually all other places. Since only 0-order diffracted light and 1-order diffracted light from the periodic step difference pattern MG are used in this example, the function Pir(u) can be a constant. In addition, the function $\exp(\pi i P u)$ in Equation (6) becomes 1 in 0-order diffracted light (u=0) and -1 in ±1-order diffracted light (u=±1/P).

Thus, the amplitude $\phi_0$ of 0-order diffracted light and the amplitude $\Phi_1$ of 1-order diffracted light emitted from the periodic step difference pattern MG are respectively expressed as in Equations (8) and (9), discussed above:

$$\phi_0 = a \cdot \Phi_a + b \cdot \Phi_b \quad (8)$$

$$\phi_1 = a' \cdot \Phi_a - b' \cdot \Phi_b \quad (9)$$

Wherein coefficients a' and b' are respectively expressed as in Equations (10) and (11), discussed above:

$$a' = P \cdot \sin(\pi a/P)/\pi \quad (10)$$

$$b' = P \cdot \sin(\pi b/P)/\pi \quad (11)$$

In this way, the process of deriving amplitudes $\phi_0$ and $\phi_1$ from amplitude reflecting powers $\Phi_a$ and $\Phi_b$ is described in FIG. 4 using polar coordinates in a Gaussian plane.

Figure 4A:
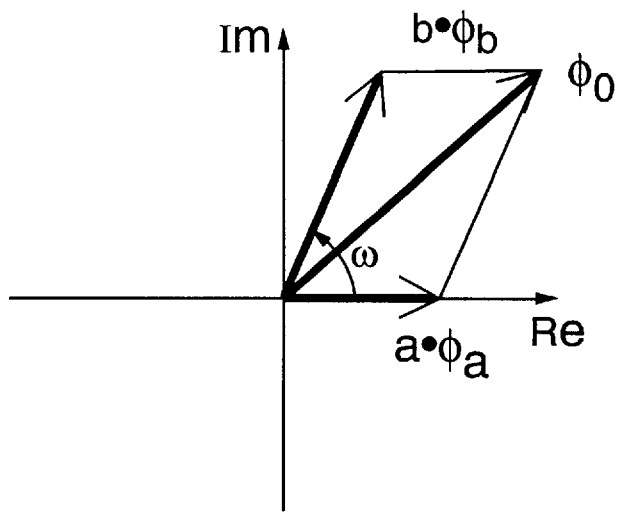
FIGS. 4(a)–4(c) is an explanatory diagram showing, by their polar coordinates on a Gaussian plane, the process of deriving the diffracted beam amplitudes $\phi_p$ and $\phi_1$ from amplitude reflection powers $\Phi_a$ and $\Phi_b$.
Figure 4B:
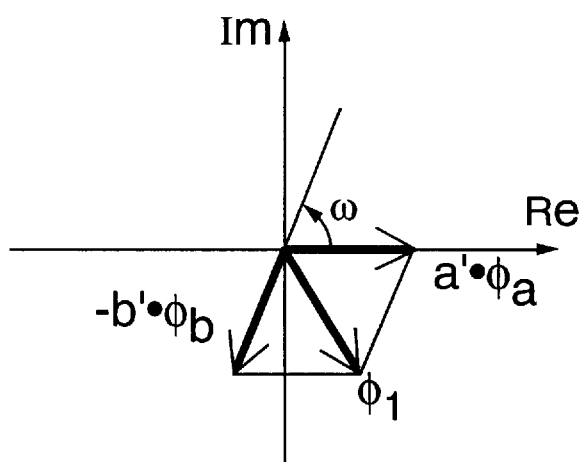
Figure 4C:
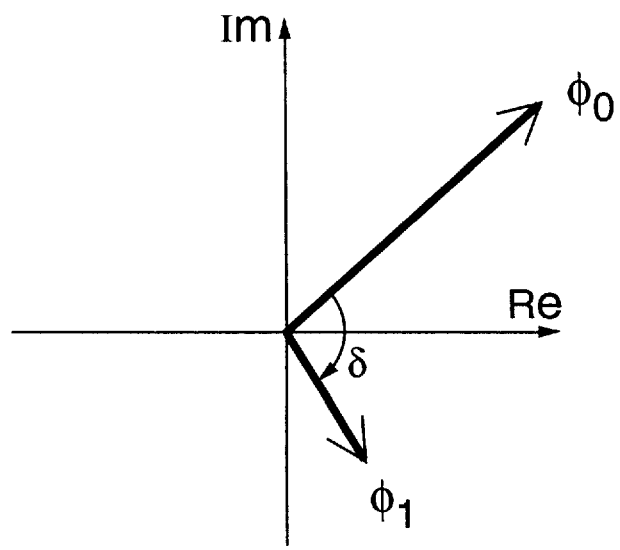

FIG. 4(a) expresses that the amplitude $\phi_0$ of 0-order diffracted light is determined by Equation (8) according to the amplitude reflecting powers $\Phi_a$ and $\Phi_b$, and FIG. 4(b) expresses that the amplitude $\phi_1$ of 1-order diffracted light is determined by Equation (9) according to the amplitude reflecting powers $\Phi_a$ and $\Phi_b$. In this case, the phase difference between the amplitude reflecting powers $\Phi_a$ and $\Phi_b$ is defined as $\omega$. FIG. 4(c) also shows the amplitudes $\phi_0$ and $\phi_1$ obtained from FIG. 4(a) and (b) in the same complex plane (polar coordinates), and the phase difference $\delta$ in FIG. 4(c) is an amount which is ½ the phase difference 2$\delta$ of the two detection signals IA1, IB1 in FIG. 8, when, e.g., using the integrated light fluxes A1, B1 of wavelength $\lambda_1$ in FIG. 5. Consequently, that phase difference $\delta$ can be calculated with the phase differences in the respective two detection signals IA1, IB1, detection signals IA2, IB2, and detection signals IA3, IB3 for each wavelength.

Also, as for the ratio of the magnitudes of the amplitudes $\phi_1$ and $\phi_0$ ($|\phi_1|:|\phi_0|$), it is possible to measure this from the signals obtained by photoelectrically converting the above diffracted light. In other words, because the maximum values $A1_{max}$, $B1_{max}$ of detection signals IA1, IB1 in FIG. 4 are the intensities under the condition in which amplitudes $\phi_0$ and $\phi_1$ were added in phase with each other, and the minimum values $A1_{min}$, $B1_{min}$ of detection signals IA1, IB1 are intensities under the condition in which amplitudes $\phi_0$ and $\phi_1$ were added 180° out of phase with each other, when, e.g., using integrated light fluxes A1, B1 of wavelength $\lambda_1$ in FIG. 1, the following are true:

$$A1_{max} = B1_{max} = (|\phi_0| + |\phi_1|)^2 \quad (27)$$

$$A1_{min} = B1_{min} = (|\phi_0| - |\phi_1|)^2 \quad (28)$$

Also, due to the existence of Equations (27) and (28), the contrast $\gamma$ in the detection signals IA1 and IB1 normally is defined as follows:

$$\gamma = (A1_{max} - A_{min})/(A_{max} + A_{min}) \quad (29)$$

Substituting this Equation (29) into Equations (27) and (28), the contrast $\gamma$ becomes as follows:

$$\gamma = 2 \cdot |\phi_0| \cdot |\phi_1|/(|\phi_0|^2 + |\phi_1|^2) \quad (30)$$

Consequently, by measuring the contrast $\gamma$ and substituting the following Equation (31), which includes the value of the ratio $\beta$ between the absolute value of amplitude $\phi_1$ and absolute value of amplitude $\phi_0$, into Equation (30), value of that ratio $\beta$ is expressed as in Equation (32).

$$|\phi_1| = \beta \cdot |\phi_0| \quad (31)$$

$$\beta = \{1 \pm (1-\gamma^2)^{1/2}\}/\gamma \quad (32)$$

The sign $\pm$ in Equation (32) cannot be definitively determined, but because the intensity of 1-order diffracted light is usually lower than that of 0-order diffracted light, the negative sign is used. However, there are some cases in which the plus sign is used. Then, using the phase $\delta$ and the value of the ratio $\beta$ determined by Equation (32), the amplitude $\phi_1$ can be expressed by the following equation:

$$\phi_1 = \beta \cdot \phi_0 \cdot \exp(i\delta) \quad (33)$$

If the phase $\delta$ and the value of the ratio $\beta$ are found, as described above, it is possible to find the amplitude reflecting powers $\Phi_a$ and $\Phi_b$ of the depressions and protrusions in the periodic step difference pattern MG from the amplitude of the diffracted light by back-tracking on the aforementioned process by which the amplitudes of the diffracted light were derived from the amplitude reflecting power. Specifically, this could be accomplished by solving the simultaneous equation comprising Equation (8) and Equation (9) based on known parameters.

Generally, in the fabrication of semiconductor integrated circuits, the controllability of the width of the pattern lines is greater than the controllability of fabricating the step difference amount, which is being measured. Consequently, the widths a, b of the depressions and protrusions in the periodic step difference pattern MG are quite close to their respective design values, so that those design values can be used as known values. Similarly, the coefficients a' and b' resulting from Equations (10) and (11) can be treated as known values. Because of this, the only unknown variables (unmeasured variables) in the simultaneous equation comprising Equation (8) and Equation (9) are the amplitude reflecting powers $\Phi_a$ and $\Phi_b$, and the simultaneous equation can be solved for $\Phi_a$ and $\Phi_b$. As a result, the amplitude reflecting powers $\Phi_a$ and $\Phi_b$ can be expressed as follows. Now, Equation (33) has been substituted for amplitude $\phi_1$.

$$\Phi_a = (b' \cdot \phi_0 + b \cdot \phi_1)/(a \cdot b' + a' \cdot b) \quad (34)$$

$$\Phi_b = (a' \cdot \phi_0 - a \cdot \phi_1)/(a \cdot b' + a' \cdot b) \quad (35)$$

The phase of amplitude $\phi_0$ in Equation (34) and Equation (35) (as in (19), (20)) is not already known, but since it is sufficient as a final result to know the phase difference between the amplitude reflection powers $\Phi_a$ and $\Phi_b$ (=$\omega$), the phase of the amplitude $\phi_0$ (the angle made by amplitude $\phi_0$ with the Re axis in FIG. 4) can be set to any arbitrary value.

Consequently, the values of the amplitude reflecting powers $\Phi_a$ and $\Phi_b$ (complex numbers) can be found from Equation (34) and Equation (35). Both of the respective phases $\omega_a$, $\omega_b$ can then be found from the real number parts and imaginary number parts of the amplitude reflecting powers $\Phi_a$ and $\Phi_b$. In other words, where the real number parts and imaginary number parts of amplitude reflecting power $\Phi_a$ are $Re(\Phi_a)$ and $Im(\Phi_a)$, and the real number parts and imaginary number parts of amplitude reflecting power $\Phi_b$ are $Re(\Phi_b)$ and $Im(\Phi_b)$, the phases $\omega_a$ and $\omega_b$ are expressed as follows:

$$\omega_a = \tan^{-1}\{Im(\Phi_a)/Re(\Phi_a)\} \quad (36)$$

$$\omega_b = \tan^{-1}\{Im(\Phi_b)/Re(\Phi_b)\} \quad (37)$$

The difference between the two phases $\omega_a$ and $\omega_b$ ($\omega_b - \omega_a$) is then calculated as $\omega$, which phase difference $\omega$ becomes the phase difference between the amplitude reflecting powers $\Phi_a$ and $\Phi_b$ ((36), (37) are the same as (21), (22)). Also, as above, since there is usually a relationship ($4\pi d/\lambda = \omega$) between the step difference d in the periodic step difference pattern MG and said phase difference $\omega$, the step difference d is calculated from that phase difference $\omega$. The above comprises the principles for calculating the step difference d in this example. However, the respective phase differences $\omega_1 - \omega_3$ are calculated for each wavelength $\lambda_1 - \lambda_3$ in this example, and the final step difference D is determined from these calculation results.

Next, an example of the procedure for calculating the phase difference $\omega_1$ at wavelength $\lambda_1$ will be described as one example. The phase differences $\omega_2$, $\omega_3$ for the other wavelengths $\lambda_2$, $\lambda_3$ are similarly calculated. First, phase difference $\delta 1$, which is ½ the phase difference between the detection signals IA1 and IB1, as described above, is calculated by the phase difference detector 132A in FIG. 7. In addition, the maximum values $A1_{max}$, $B1_{max}$ of detection signals IA1, IB1 and the minimum values $A1_{min}$, $B1_{min}$ of detection signals IA1, IB1 are detected, as shown in FIG. 8, by the peak hold unit and bottom hold unit in the contrast detector 133A, and the maximum value $A1_{max}$ and minimum value $A1_{min}$ are substituted into Equation (14) to find the contrast $\gamma$ of the detection signals IA1, IB1. The contrasts of the two detection signals is equal as long as there is not much asymmetry in the periodic step difference pattern MG, but in the event that the detection signals IA1, IB1 do have different contrasts, the contrast of detection signal IB1 is calculated substituting the maximum value $B1_{max}$ and minimum value $B1_{min}$, into Equation (14) in place of maximum value $A1_{max}$ and minimum value $A1_{min}$, and the average of the two resulting contrasts is used as a new $\gamma$. The resulting phase difference $\delta 1$ and contrast $\gamma$ are supplied to the individual step difference calculator 134A in FIG. 7.

Furthermore, in the individual step difference calculator 134A the contrast $\gamma$ is substituted into Equation (32) to find the value of the ratio $\beta$ of the magnitudes of the amplitude $\phi_1$ of the 1-order diffracted light and the amplitude $\phi_0$ of the 0-order diffracted light, which is substituted with the above phase difference $\delta 1$ for the values of $\beta$ and $\delta$ in Equation (33) to find the exact (complex value) relationship between amplitude $\phi_i$ and amplitude $\phi_0$.

The operator, for example, can also input, via the data entry device 121 and the main control system 118 shown in FIG. 5, to the memory 135 shown in FIG. 7 the values for the respective widths a, b of the depressions and protrusions in the periodic step difference pattern MG, the period P of the periodic step difference pattern MG, and the wavelengths $\lambda_1-\lambda_3$ in advance. The individual step difference calculator 134A then substitutes the input values for the widths a, b and the period P into Equation (10) and Equation (11) to calculate the coefficients a', b', which calculated coefficients a', b' are substituted into Equation (34) and Equation (35) to calculate the (complex number) values of the amplitude reflecting powers $\Phi_a$, $\Phi_b$. Furthermore, the respective phases $\omega_a$, $\omega_b$ of the amplitude reflecting powers $\Phi_a$, $\Phi_b$ are found from Equation (36) and Equation (37), whereby the phase difference $\omega$ ($=\omega_b-\omega_a$) is calculated. The phase difference $\omega$ at this wavelength $\lambda_1$ is defined as phase difference $\omega_1$. This phase difference $\omega_1$ is supplied to the final step difference calculator 136 in FIG. 7.

As described above, phase difference $\omega_1$ corresponds to the difference in round trip light paths (phase difference) for step difference d in the periodic step difference pattern MG, so that the step difference $d_1$ measured at wavelength $\lambda_1$ can be expressed by means of $\omega_1=4\pi d/\lambda_1$, i.e., the following relationship:

$$d_1=\omega_1\cdot\lambda_1/(4\pi) \tag{38}$$

Wherein, since the range of the phase difference $\omega_1$ is 0 to $2\pi$, if only wavelength $\lambda_1$ is used, the range of the depth $d_1$ which can be specified is from $J_1\cdot\lambda_1/(4\pi)$ to $(J_1+\omega_1)\cdot\lambda_1/(4\pi)$, leaving an uncertainty of $J_1\cdot\lambda_1/(4\pi)$.

Similarly, the phase differences $\omega_2$ and $\omega_3$ at wavelengths $\lambda_2$ and $\lambda_3$ are calculated in the individual step difference calculators 134B and 134C in FIG. 7, the results of which calculations are supplied to the final step difference calculator 136. Respective specified uncertainties likewise remain in the step differences $d_2$ and $d_3$ calculated from relationship equations which are similar to Equation (38) for phase differences $\omega_2$ and $\omega_3$.

Incidentally, some uncertain elements remain in determining the ± symbol when determining the value of the ratio β in Equation (32), but instead of finding β with Equation 32) from the contrast γ of the detection signals, as described above, β may also be calculated by directly measuring the light quantity ratio of the 1-order diffracted light and the 0-order diffracted light and then taking its square root. One method for detecting the light quantity ratio is, e.g., to place a shutter capable of blocking at least one of the transmission beams LFP, LFM in the vicinity of the spatial filter 106 used as light flux selection member in FIG. 5, and after the depth measurement described above is completed, or before it is started, to block one or the other of the transmission beams LFP, LFM and find the respective intensity ratios of the detection signals IA1–IA3, IB1–IB3 obtained at this time from the photoelectric detectors 113a, 113b, 115a, 115b, 116a, 116b.

In this way, when one or the other of the transmission beams LFP, LFM has been blocked by the shutter, since there is only one light beam of each wavelength entering the periodic step difference pattern MG, the respective detection signals IA1–IA3, IB1–IB3 are DC signals with no beat component. If, e.g., the transmission beam LFM has been blocked by the shutter, only the 0-order diffracted light of transmission beam LFP enters photoelectric detectors 113b, 115b, 116b from the periodic step difference pattern MG, whereby detection signals IB1–IB3 indicate the light quantity of 0-order diffracted light at each wavelength, while only the 1-order diffracted light of transmission beam LFP enters photoelectric detectors 113a, 115a, 116a from the periodic step difference pattern MG, whereby detection signals IA1–IA3 indicate the light quantity of 1-order diffracted light at each wavelength. Thus, the value of the ratio β of the intensities of 0-order diffracted light to 1-order diffracted light is found. Conversely, the value of the intensity ratio can similarly be found by blocking the transmission beam LFP with the shutter, and the average of the two can be used as β.

In this example, as explained above, the phase differences $\omega_n$ measured for each wavelength $\lambda_n$ (n=1–3) is in the range 0–$2\pi$ [rad], whereby the step difference $d_n$ at each wavelength $\lambda_n$ can be specified as being in the range from 0 to $\lambda_n/2$. Meanwhile, in patterns where the step difference is greater than $\lambda_n/2$, e.g., in $0.7\cdot\lambda_n$ patterns, the step difference will be seen as 0.2 $\lambda_n$ ($=0.7\cdot\lambda_n-\lambda_n/2$). In other words, there is an uncertainty of $J_n\cdot\lambda_n/2$ (Jn is an integer) in the measurement of the step difference dn.

In order to eliminate this uncertainty (to increase the accuracy), in this example, the final step difference calculator 136 determines the value of integer $J_n$ by comparing the phase differences $\omega_n$ at the various wavelengths $\lambda_n$. In other words, where the value of each integer $J_n$ (uncertain integers) at each wavelength $\lambda_n$ (n=1–3) are considered to be unknown quantities, and the value of the calculated phase difference $\omega_n$ divided by $2\pi$ is $\Omega_n$, the true step difference D for the periodic step difference pattern MG is expressed as follows:

$$D=(J_1+\Omega_1)\cdot\lambda_1/2$$
$$D=(J_2+\Omega_2)\cdot\lambda_2/2$$
$$D=(J_3+\Omega_3)\cdot\lambda_3/2 \tag{39}$$

In this case, it is assumed that each $J_n$ is an integer and that $\lambda_1<\lambda_2<\lambda_3$, which implies a relationship of $J_1\geq J_2\geq J_3$. By using this relationship it is possible to find each $J_n$.

For example, the following relationship is obtained from the relationship between wavelengths $\lambda_1$ and $\lambda_2$ in Equation (39):

$$J_1=(\lambda_2/\lambda_1)\cdot(J_2+\Omega_2)-\Omega_1 \tag{40}$$

Furthermore, the following equation is obtained by subtracting $J_2$ from both sides of Equation (40).

$$J_1-J_2=(\lambda_2/\lambda_1-1)J_2+\Omega_2\cdot\lambda_2/\lambda_1-\Omega_1 \tag{41}$$

Since this Equation (26) is also a non-negative integer, Equation (41) can be modified as follows by newly letting the non-negative integer in Equation (41) ($J_1-J_2$) be the integer L:

$$J_2=(L+\Omega_1-\Omega_2\cdot\lambda_2/\lambda_1)/(\lambda_2/\lambda_1-1) \tag{42}$$

Consequently, by finding a value for non-negative integer L such that the value of Equation (42) is an integer, it becomes simple to determine the value of integer $J_2$. The step difference D in periodic step difference pattern MG is then calculated by substituting the value for this integer $J_2$ and the phase difference $\omega_2$ ($\Omega_2$) at wavelength $\lambda_2$ into the second equation in Equation (39).

Now, when the step difference in the periodic step difference pattern MG is limited to approximately 5 times each wavelength $\lambda_n$ or less, the value of the integer L is limited to 0 or 1, making calculation of the integer $J_2$ in Equation (42) even easier.

On the other hand, when the upper limit of the true step difference D in the periodic step difference pattern MG is completely unknown, it becomes necessary to examine higher values for integer L, and depending on the case, there may be two or more values for integer L which make Equation (42) an integer (and consequently, two or more values for integer $J_2$ and for step difference D). In this kind of situation, the two or more resulting values for step distance D may be substituted, e.g., into the third equation of Equation (39), and the value for the step difference D when the integer $J_3$ relative to wavelength $\lambda 3$ becomes an integer taken as the final step difference. Thus, even if the true step difference D is an extremely large value, that step difference D can be specified by using the values of the phase differences $\omega_1-\omega_3$ at the three wavelengths $\lambda_1-\omega_3$.

Furthermore, it also is possible to find a rough range for the step difference in the periodic step difference pattern MG in advance using a past measurement apparatus, and then determine the value of the true step difference D by the method in the condition of embodiment discussed above within that range. It also is possible to carry out step difference measurement using transmission beams of 4 or more wavelengths.

Incidentally, the "magnitudes" of the amplitude reflecting powers $\Phi_a$, $\Phi_b$ of the depressions and protrusions in the periodic step difference pattern MG vary depending on the material (reflecting power) of the periodic step difference pattern MG, but in this example, the step difference d can be found based only on these phase differences $\omega_1-\omega_3$, regardless of the "magnitude" (reflecting power) of the amplitude reflecting powers $\Phi_a$, $\Phi_b$. Consequently, it is possible to precisely measure the step difference even in patterns in which the materials in the depressions and the protrusions of the periodic step difference pattern MG are different. Also, if the materials in the depressions and protrusions of the periodic step difference pattern MG are materials which give different phase shifts in the reflected light (materials with complex refractive indexes), this phase shift degrades the precision of the step difference measurement in the pattern, but this degradation generally is extremely small and poses no real problem to the measurement. Of course, it would also be possible to more precisely calculate this phase shift from the complex refractive indexes of the materials of the depressions and protrusions (which usually is already known), and thereby correct the measured phase difference (pattern step difference).

Furthermore, the detection light fluxes used in this example comprise multiple wavelengths, but measurements by these multiple wavelengths are individually performed for each wavelength, and the differences in the intensities of the reflected light (reflecting power) between wavelengths have not effect. Consequently, there is absolutely no problem with the reflection spectrum of the pattern being detected, which has been a problem in past depth measuring apparatuses, making highly accurate depth measurement possible for patterns of any material.

In addition, in the example embodiment discussed above, as an example of a pattern being detected, a pattern was shown in which the boundaries (side walls) between the depressions and the protrusions were plumb, as in the periodic step difference pattern MG, but highly accurate measurement is of course possible even if the pattern has tapered (slanted) side walls. In this case, the respective widths a, b of the depressions and protrusions entered in the step difference measuring unit 117 in FIG. 5 would no longer be values that fulfilled (a+b=P), but as in the above condition of embodiment, the step difference in the pattern can be calculated based on the values for these widths a, b.

Also, in cases when asymmetry (tapers, etc.) exist in the depressions of the pattern being detected, unlike the example shown in FIG. 8, the contrasts of detection signals IA1, IB1 photoelectrically converted from integrated light fluxes A1, B1 no longer match, but depth measurement with the same level of high accuracy as with a pattern with no asymmetry becomes possible by employing the average of the two.

Now, in the above example embodiment, an interference pattern in which the period of the amplitude is 2P relative to the measurement direction is formed by shining two light fluxes onto the pattern being detected, which has a period P. However, it is also acceptable to form an interference pattern with an amplitude period of 2P/k (k is an integer equal to or greater than 2) relative to the direction of measurement by shining two light fluxes onto the pattern being detected, which has a period P. In this case, where the 2 light fluxes are referred to as the first and second light flux, the normal reflected light of the first light flux (0-order diffracted light) from the pattern being detected and the k-order diffracted light of the second light flux from the pattern being detected are emitted parallel and interfere with each other to form a first integrated light flux, while the normal reflected light of the second light flux (0-order diffracted light) from the pattern being detected and the k-order diffracted light of the first light flux from the pattern being detected are emitted parallel and interfere with each other to form the second integrated light flux. Consequently, depth detection can be accomplished just as when an integrated light flux of 0-order diffracted light and 1-order diffracted light was used.

With the depth measuring method of this example embodiment, because the depth of depressions in a pattern being detected is calculated based on the photoelectrically converted signals of first and second integrated light fluxes composed of respective diffracted light from the pattern being detected and the wavelength of the detection light beam, it has the advantage of being able to perform high-precision measurement of the depth (step difference) of the depressions in the pattern being detected in which depressions and protrusions periodically repeat, such as a fine groove pattern. Furthermore, since light beams of multiple wavelengths are used in this invention, it has the advantage of being able to accurately measure even depths which are substantially larger than the various wavelengths, regardless of the depth of the approximately magnitude of each wavelength. In addition, this invention makes it possible to accurately measure the depth (step difference) of depressions even in detection patterns in which the reflecting power varies with the wavelength due to the properties peculiar to the material or thin film interference.

Also, when the phase and contrast of the photoelectrically converted signals of the first and second integrated light fluxes, the wavelengths of the first and second light beams, and the ratio of the widths of the depressions and protrusions in the pattern being detected in a specified direction (the direction of measurement) as the shape of the pattern being detected are used in calculating the depth of the depressions in that pattern being detected, since the fabrication of said widths of the depressions and protrusions in the measurement direction can usually be accurately accomplished, the depth can be accurately calculated by using the design values as said widths.

Also, when the respective ratios of the light quantities of the normal reflected light and the m-order diffracted light from the pattern for the multiple wavelengths are measured to calculate the depth of a depression in the pattern being detected, if the respective phases of the photoelectrically converted signals of the first and second integrated light fluxes obtained for multiple wavelengths, those multiple wavelengths, the ratio of the widths of the depressions and protrusions in a specified direction in the pattern being detected as the shape of the pattern being detected, and the respective ratios of the light quantities of the normal reflected light and the m-order diffracted light for the multiple frequencies are used, the depth can be more precisely calculated than if the ratio of the light quantities calculated by the contrast of the photoelectrically converted signals from the first and second integrated light fluxes are used.

Thus, this invention is not limited just to the example embodiments described above, and a variety of compositions can be conceived within the scope that does not depart from the gist of this invention.

What is claimed is:

1. A method for optically measuring a depth of a depression in a pattern formed as periodically repeated depressions and protrusions in a specified direction on a substrate, the method comprising:

(a) scanningly in the specified direction, illuminating a first and a second coherent light beam, each having a respective wavelength, onto a portion of the pattern including the depression so as to form an integrated light flux including an interference pattern corresponding to the portion of the pattern being scanningly illuminated in the specified direction;

(b) photoelectrically converting the integrated light flux to a corresponding electrical signal; and (c) from the electrical signal and the wavelengths of the first and second light beams, calculating the depth of the depression in the pattern.

2. The method of claim 1, wherein, when the the pattern being detected has a period P, and the interference pattern has a period 2P/N in the specified direction.

3. The method of claim 1, wherein the integrated light flux comprises a first integrated light flux generated by integrating a normal reflected light of the first light beam and an N-order diffracted light of the second light beam from the pattern, and a second integrated light flux generated by integrating a normal reflected light of the second light beam and an N-order diffracted light of the first light beam from the pattern.

4. The method of claim 1, wherein the electrical signal has a phase and a contrast, and the depressions and protrusions in the pattern each have a width in the specified direction, the depth of the depression in the pattern being also calculated from the phase and contrast of the signal and a ratio of the widths of the depressions and protrusions in the pattern in the specified direction.

5. An apparatus for optically measuring a depth of a depression in a pattern formed of depressions and protrusions periodically repeating in a specified direction and period P on a substrate, the apparatus comprising:

(a) a light-transmitting optical system that illuminates first and second coherent light beams onto a region of the pattern, each light beam having a wavelength λ and each being incident on the region at a crossing angle θ relative to an axis of the light-transmitting optical system, so as to generate reflected light from the region, the reflected light comprising first and second integrated light fluxes that interfere with one another and produce and interference pattern having a period of 2P/N for an amplitude distribution in the specified direction, the first integrated light flux being formed by integrating normal reflected light of the first light beam and N-order diffracted light of the second light beam from the region, and the second integrated light flux being formed by integrating normal reflected light of the second light beam and N-order diffracted light of the first light beam from the region;

(b) a first photoelectric detector for receiving the first integrated light flux and for photoelectrically producing therefrom a corresponding first detection signal;

(c) a second photoelectric detector for receiving the second integrated light flux and for photoelectrically producing therefrom a corresponding second detection signal;

(d) a relative scanning system for causing the pattern to be scanned in the specified direction relative to the first and second light beams as the pattern is being illuminated by the first and second light beams; and (e) a depth calculator for receiving the first and second detection signals and for calculating therefrom and from the wavelengths λ the depth of the depression in the pattern.

6. The apparatus of claim 5, wherein the angles θ satisfy the expression: $\sin\theta = \lambda/(2/P)$.

7. A method for optically measuring the depth of depressions in a region of a pattern on a substrate, the pattern comprising depressions and protrusions each having a width and periodically repeating in a specified direction on the substrate, the method comprising:

(a) illuminating multiple pairs of first and second coherent light beams at a region of the pattern, the first and second coherent light beams of each pair having a respective wavelength λ and being incident on the region at an incidence angle θ;

(b) while illuminating the region of the pattern, causing movement of the pattern and the pairs of light beams relative to each other in the specified direction so as to cause the pairs of light beams to illuminate successive regions of the pattern;

(c) producing from each pair of first and second light beams an interference pattern comprising first and second integrated light fluxes;

(d) receiving and photoelectrically converting each of the first and second integrated light fluxes from each pair of first and second light beams into a corresponding electrical signal having a phase and a contrast; and (e) from the corresponding electrical signals and from the wavelengths of the respective pairs of first and second light beams, calculating the depth of the depressions in the pattern in the specified direction.

8. The method of claim 7, wherein the period of the pattern is P and the period of the interference pattern in the measurement direction is 2P/N (N is a natural number).

9. The method of claim 7, wherein for each interference pattern, the first integrated light flux is formed by integrating a normal reflected light of the first light beam from the region and an N-order diffracted light of the second light beam from the region, and the second integrated light flux is formed by integrating a normal reflected light of the second light beam from the region and an N-order diffracted light of the first light flux from the region, which first and second integrated light fluxes are respectively obtained for each of the multiple wavelengths.

10. The method of claim 7, wherein the depth of depressions in the pattern are calculated from the phase and contrast of the electrical signals corresponding to the first and second integrated light fluxes obtained for each of the multiple wavelengths, and a ratio of the widths of the depressions and protrusions in the pattern in the specified direction.

11. The method of claim 9, wherein the depth of depressions in the pattern are calculated from ratios of light quantities of the normal reflected light and the N-order diffracted light detected for each of the multiple wavelengths, the phases of the electrical signals corresponding to the first and second integrated light fluxes obtained for each of the multiple wavelengths, and a ratio of the width of the depressions and protrusions in the specified direction in the pattern.

12. An apparatus for optically measuring the depth of depressions in a pattern comprised of depressions and protrusions that repeat at a period P in a specified direction on a substrate, the apparatus comprising:

(a) a light transmitting optical system that illuminates multiple pairs of light beams of mutually differing wavelengths onto the pattern, each pair of light beams comprising a first coherent light beam and a second coherent light beam, so as to form for each wavelength an interference pattern having an amplitude distribution in the specified direction having a period of 2P/N (N is a natural number);

(b) photoelectric converters that receive, for each of the wavelengths, first and second integrated light fluxes, the first integrated light flux being formed by integrating a normal reflected light of the first light beam from the pattern and an N-order diffracted light of the second light beam from the pattern, and the second integrated light flux being formed by integrating a normal reflected light of the second light beam from the pattern and an N-order diffracted light of the first light beam from the pattern;

(c) a relative scanning system that relatively scans the pattern on the substrate and the interference pattern in the specified direction; and (d) a depth calculator unit for calculating the depth of the depressions in the pattern based on the wavelengths of the first and second light beams and on the electrical signals output from the photoelectric converters when the pattern being detected and the interference pattern are being relatively scanned by the relative scanning system.

13. A method for optically measuring a depth of a depression in a pattern formed as periodically repeated depressions and protrusions in a specified direction on a substrate, the method comprising:

(a) directing a first light beam and a second light beam, each having a respective wavelength, which can be the same or different, and each light beam being coherent the other, to a portion of the pattern including the depression so as to form an interference pattern corresponding to the portion;

(b) scanning the pattern and the interference pattern relative to each other to form an integrated light flux of the first and second light beams and photoelectrically converting the integrated light flux to a corresponding electrical signal; and (c) from the electrical signal and the wavelengths of the first and second light beams, calculating the depth of the depression in the pattern.

14. The method of claim 13, wherein the pattern being detected has a period P and the interference pattern has a period 2P/N, wherein N is an integer other than zero, in the specified direction.

15. The method of claim 13, wherein the integrated light flux comprises a first integrated light flux generated by integrating a normal reflected light of the first light beam and an N-order diffracted light, wherein N is an integer other than zero, of the second light beam from the pattern, and a second integrated light flux generated by integrating a normal reflected light of the second light beam and an N-order diffracted light, wherein N is an integer other than zero, of the first light beam from the pattern.

16. The method of claim 13, wherein the electrical signal has a phase and a contrast, and the depressions and protrusions in the pattern each have a width in the specified direction, the depth of the depression in the pattern also being calculated from the phase and contrast of the signal and a ratio of widths of the depressions and protrusions in the pattern in the specified direction.

17. An apparatus for optically measuring a depth of a depression in a pattern formed of depressions and protrusions periodically repeating in a specified direction and period P on a substrate, the apparatus comprising:

(a) a light-transmitting optical system that directs a first coherent light beam and a second coherent light beam to a region of the pattern so as to form an interference pattern, each light beam having a respective wavelength which can be the same or different;

(b) a relative scanning system configured and situated to scan the pattern and the interference pattern relative to each other;

(c) a light integrator configured and situated to form first and second integrated light fluxes, the first integrated light flux being formed by integrating normal reflected light of the first coherent light beam and N-order diffracted light, wherein N is an integer other than zero, of the second coherent light beam from the region, and the second integrated light flux being formed by integrating normal reflected light of the second coherent light beam and N-order diffracted light, wherein N is an integer other than zero, of the first coherent light beam from the region;

(d) a first photoelectric detector for receiving the first integrated light flux and for photoelectrically producing therefrom a corresponding first detection signal;

(e) a second photoelectric detector for receiving the second integrated light flux and for photoelectrically producing therefrom a corresponding second detection signal; and (f) a depth calculator, connected to the first photoelectric detector and second photoelectric detector, configured and situated to receive the first and second detection signals and to calculate therefrom and from the respective wavelengths the depth of the depression in the pattern.

18. The apparatus of claim 17, wherein each coherent light beam is incident on the region at a respective crossing angle $\theta$ relative to an axis of the light-transmitting optical system, the respective crossing angles satisfying the expression: $\sin\theta = \lambda/(2P)$.

19. A method for optically measuring the depth of depressions in a region of a pattern on a substrate, the pattern comprising depressions and protrusions each having a width and periodically repeating in a specified direction on the substrate, the method comprising:

(a) directing multiple pairs of first and second coherent light beams to a region of the pattern;

(b) producing from each pair of first and second light beams an interference pattern comprising first and second integrated light fluxes;

(c) moving the pattern and the interference patterns relative to each other;

(d) receiving and photoelectrically converting each of the first and second integrated light fluxes from each pair of first and second light beams into a corresponding electrical signal; and (e) from the corresponding electrical signals and from the wavelengths of the respective pairs of first and second light beams, calculating the depth of the depressions in the pattern in the specified direction.

20. The method of claim 19, wherein:

the first and second coherent light beams of each pair have a respective wavelength and are incident on the region at an incidence angle θ; and the angles θ satisfy the expression $\sin\theta = \lambda/(2P)$.

21. The method of claim 19, wherein the pattern has a period P and the interference pattern in the measurement direction has a period 2P/N, wherein N is an integer other than zero.

22. The method of claim 19, wherein, for each interference pattern, the first integrated light flux is formed by integrating a normal reflected light of the first coherent light beam from the region and an N-order diffracted light, wherein N is an integer other than zero, of the second coherent light beam from the region, and the second integrated light flux is formed by integrating a normal reflected light of the second coherent light beam from the region and an N-order diffracted light, wherein N is an integer other than zero, of the first coherent light flux from the region, the first and second integrated light fluxes being respectively obtained for each of the multiple wavelengths.

23. The method of claim 22, wherein the depths of depressions in the pattern are calculated from (i) ratios of light quantities of the normal reflected light and the N-order diffracted light detected for each of the multiple wavelengths, (ii) phases of the electrical signals corresponding to the first and second integrated light fluxes obtained for each of the multiple wavelengths, and (iii) a ratio of the width of the depressions and protrusions in the specified direction in the pattern.

24. The method of claim 19, wherein:

each electrical signal has a respective phase and contrast; and the depth of depressions in the pattern are calculated from (i) the phase and contrast of the electrical signals corresponding to the first and second integrated light fluxes obtained for each of the multiple wavelengths, and (ii) a ratio of the widths of the depressions and protrusions in the pattern in the specified direction.

25. An apparatus for optically measuring the depth of depressions in a pattern comprised of depressions and protrusions that repeat at a period P in a specified direction on a substrate, the apparatus comprising:

(a) a light-transmitting optical system that directs multiple pairs of light beams of mutually differing wavelengths onto the pattern, each pair of light beams comprising a first coherent light beam and a second coherent light beam, so as to form for each wavelength an interference pattern having an amplitude distribution in the specified direction having a period of 2P/N, wherein N is an integer other than zero;

(b) photoelectric converters that receive, for each of the wavelengths, first and second integrated light fluxes, the first integrated light flux being formed by integrating a normal reflected light of the first coherent light beam from the pattern and an N-order diffracted light, wherein N is an integer other than zero, of the second coherent light beam from the pattern, and the second integrated light flux being formed by integrating a normal reflected light of the second coherent light beam from the pattern and an N-order diffracted light, wherein N is an integer other than zero, of the first coherent light beam from the pattern;

(c) a relative scanning system configured and situated to scan the pattern on the substrate and the interference pattern relative to each other; and (d) a depth calculator unit, connected to the photoelectric converters, that calculates the depth of the depressions in the pattern based on the wavelengths of the first and second light beams and on the electrical signals output from the photoelectric converters when the pattern being detected is being scanned by the relative scanning system.

26. A method for optically measuring a depth of a depression in a pattern formed as periodically repeated depressions and protrusions in a specified direction on a substrate, the method comprising:

(a) directing a first coherent light beam and a second coherent light beam, each having a respective wavelength, which can be the same or different, and being coherent with each other, to a portion of the pattern including the depression;

(b) forming an integrated light flux from light of the first and second light fluxes reflected from the pattern;

(c) photoelectrically converting the integrated light flux to a corresponding electrical signal; and (d) calculating the depth of the depression in the pattern in accordance with the electrical signal and the wavelengths of the first and second light beams.

27. The method of claim 26, wherein:

the pattern being detected has a period P, the interference pattern is generated while the pattern and the first and second coherent light beams are being moved relative to each other, and the interference pattern has a period 2P/N, wherein N is an integer other than zero, in the specified direction.

28. The method of claim 26, wherein the first and second coherent light beams illuminate the pattern so as to form the integrated light flux, the integrated light flux comprising a first integrated light flux generated by integrating a normal reflected light of the first coherent light beam and an N-order diffracted light, wherein N is an integer other than zero, of the second coherent light beam from the pattern, and a second integrated light flux generated by integrating a normal reflected light of the second coherent light beam and an N-order diffracted light, wherein N is an integer other than zero, of the first coherent light beam from the pattern.

29. The method of claim 26, wherein the electrical signal has a phase and a contrast, and the depressions and protrusions in the pattern each have a respective width in the specified direction, the depth of the depression in the pattern also being calculated from the phase and contrast of the signal and a ratio of the widths of the depressions and protrusions in the pattern in the specified direction.

* * * * *

UNITED STATES PATENT AND TRADEMARK OFFICE
CERTIFICATE OF CORRECTION

PATENT NO. : 5,982,489

DATED : November 9, 1999

INVENTOR(S) : Naomasa Shiraishi

It is certified that error appears in the above-identified patent and that said Letters Patent is hereby corrected as shown below:

In the Specification:

Column 2, line 23, "are surround" should be --area surrounding--.

Column 6, line 17, the second occurrence of "can be" should be deleted.

Column 13, line 26, the end bracket "]" should be an end parentheses --)--, and "indexes" should be be --indices--.

Column 13, line 32, "indexes" should be --indices--.

Column 14, line 28, "patters" should be --patterns--.

Column 21, line 53, " $\phi(u) = \{A(u) + \phi B(u) \cdot \exp(\pi i P u)\} \cdot Pir(u)$ " should be -- $\phi(u) = \{\phi A(u) + \phi B(u) \cdot \exp(\pi i P u)\} \cdot Pir(u)$ --.

Column 25, lines 37-38, "Equation 32)" should be --Equation (32)--.

Column 27, line 8, "$\lambda 3$" should be --$\lambda_3$--.

Column 27, line 35, "indexes" should be --indices--.

Column 27, line 49, "not" should be --no--.

UNITED STATES PATENT AND TRADEMARK OFFICE
CERTIFICATE OF CORRECTION

PATENT NO. : 5,982,489

DATED : November 9, 1999

INVENTOR(S) : Naomasa Shiraishi

It is certified that error appears in the above-identified patent and that said Letters Patent is hereby corrected as shown below:

In the Claims:

Column 29, line 31, claim 2, the second occurrence of "the" should be deleted.

Column 29, line 61, claim 5, "and" should be --an--.

Signed and Sealed this

Twenty-second Day of May, 2001

*Attest:*

NICHOLAS P. GODICI

*Attesting Officer*     Acting Director of the United States Patent and Trademark Office